(12) United States Patent
Miyata et al.

(10) Patent No.: US 7,522,159 B2
(45) Date of Patent: Apr. 21, 2009

(54) DISPLAY APPLIANCE

(75) Inventors: Kazuhiko Miyata, Osaka (JP); Jun Koyama, Kanagawa (JP); Hiroyuki Miyake, Kanagawa (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 852 days.

(21) Appl. No.: 10/701,342

(22) Filed: Nov. 4, 2003

(65) Prior Publication Data

US 2004/0131211 A1 Jul. 8, 2004

(30) Foreign Application Priority Data

Nov. 8, 2002 (JP) ............................. 2002-325765

(51) Int. Cl.
*G09G 5/00* (2006.01)
(52) U.S. Cl. .................... 345/204; 345/87; 327/560
(58) Field of Classification Search .................. 345/30, 345/53–54, 87, 92, 94, 98, 204–205, 208, 345/211, 214; 381/120–121, 111; 327/560–566
See application file for complete search history.

(56) References Cited

U.S. PATENT DOCUMENTS

| | | | |
|---|---|---|---|
| 4,644,338 A * | 2/1987 | Aoki et al. ................. 345/92 |
| 4,758,896 A | 7/1988 | Ito | |
| 5,325,265 A | 6/1994 | Turlik et al. | |
| 5,705,829 A | 1/1998 | Miyanaga et al. | |
| 5,841,317 A * | 11/1998 | Ohmori et al. .............. 327/563 |
| 5,986,306 A | 11/1999 | Nakajima et al. | |
| 6,211,730 B1 | 4/2001 | Fujimoto | |
| 6,331,718 B1 | 12/2001 | Yamazaki et al. | |
| 6,427,017 B1 * | 7/2002 | Toki ........................... 381/190 |
| 6,600,197 B1 | 7/2003 | Nakajima et al. | |
| 6,829,131 B1 | 12/2004 | Loeb et al. | |
| 6,831,299 B2 | 12/2004 | Koyama | |
| 6,967,633 B1 * | 11/2005 | Tanaka ........................ 345/3.3 |
| 6,985,128 B1 | 1/2006 | Kida et al. | |
| 7,019,955 B2 | 3/2006 | Loeb et al. | |
| 7,208,763 B2 | 4/2007 | Koyama | |

(Continued)

FOREIGN PATENT DOCUMENTS

CN 2098775 U 3/1992

(Continued)

OTHER PUBLICATIONS

"Assimilating Image and Sound with Invisible Speaker Commercialization During 2002 by Matsushita Electric," Nikkei Electronics, 4.8, p. 37 (2002).

(Continued)

*Primary Examiner*—Richard Hjerpe
*Assistant Examiner*—Mansour M Said
(74) *Attorney, Agent, or Firm*—Cook Alex Ltd.

(57) ABSTRACT

A small-sized, light-weight display device having an audio output circuit is provided. A display device of the present invention has a flat speaker and an audio signal processing device is constructed from thin film semiconductor elements, typically, thin film transistors, on the display device. The speaker is driven by BTL driving, thereby reducing the power supply voltage and preventing degradation of the thin film transistors. A display device with a built-in audio signal processing circuit is thus reduced in size and weight.

14 Claims, 20 Drawing Sheets

U.S. PATENT DOCUMENTS

| | | | |
|---|---|---|---|
| 7,215,527 | B2 | 5/2007 | Neumann et al. |
| 2002/0102003 | A1* | 8/2002 | Ford .......................... 381/120 |
| 2002/0135708 | A1* | 9/2002 | Murden et al. ................ 349/19 |
| 2004/0189151 | A1* | 9/2004 | Athanas ...................... 310/328 |
| 2004/0206957 | A1* | 10/2004 | Inoue et al. ................... 257/59 |
| 2007/0252153 | A1 | 11/2007 | Koyama |

FOREIGN PATENT DOCUMENTS

| | | |
|---|---|---|
| CN | 2318770 Y | 5/1999 |
| CN | 1271209 A | 10/2000 |
| EP | 0 368 743 A2 | 5/1990 |
| EP | 1 047 187 A2 | 10/2000 |
| EP | 1 220 018 A1 | 7/2002 |
| JP | 62-136063 | 6/1987 |
| JP | 1-157700 | 6/1989 |
| JP | 1-189212 | 7/1989 |
| JP | 2-257664 | 10/1990 |
| JP | 4-90208 | 3/1992 |
| JP | 5-335850 | 12/1993 |
| JP | 7-38351 | 2/1995 |
| JP | 7-75189 | 3/1995 |
| JP | 7-184297 | 7/1995 |
| JP | 9-36940 | 2/1997 |
| JP | 9-116167 | 5/1997 |
| JP | 10-41758 | 2/1998 |
| JP | 11-177102 | 7/1999 |
| JP | 2001-244749 | 9/2001 |
| JP | 2001-285037 | 10/2001 |
| JP | 2002-57769 | 2/2002 |
| JP | 2002-246608 | 8/2002 |
| JP | 2003-509984 | 3/2003 |
| WO | WO 01/20948 A2 | 3/2001 |
| WO | WO 02/10851 A1 | 2/2002 |
| WO | WO 02/077702 A1 | 10/2002 |

OTHER PUBLICATIONS

Kehr, R., "1.6- to 3.6-Volt BTL Speaker Driver Reference Design," Analog Applications Journal, Feb. 2001, pp. 23-26.

"Sharp and Hosiden Jointly Prototype LCD Panel," Portelligent TechAlert Service: Component Technology—Third Quarter, 2002, abstract No. CT020926-06, http://www.teardown.com/TechAlerts/ComponentTechnology/2002/Q3/CT020926.aspx, Sep. 26, 2002, p. 4.

Austrian Patent Office search report re Singapore patent application No. SG 200306388-0, dated Jul. 5, 2007 (mailed to Applicants on Aug. 30, 2007).

Office Action re Chinese patent application No. CN 2003101203645, dated Mar. 30, 2007 (with English translation).

Office Action re Chinese patent application No. CN 200310120364.5, dated Jan. 9, 2009 (with English translation).

* cited by examiner

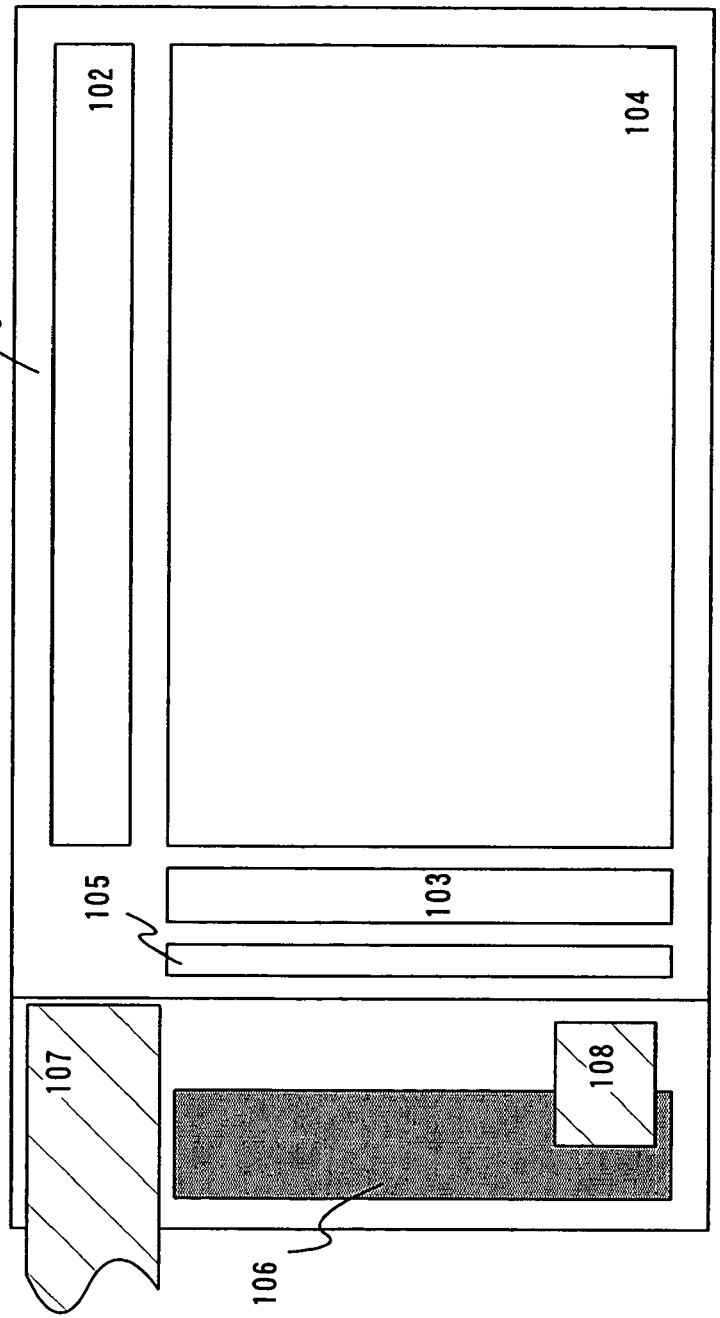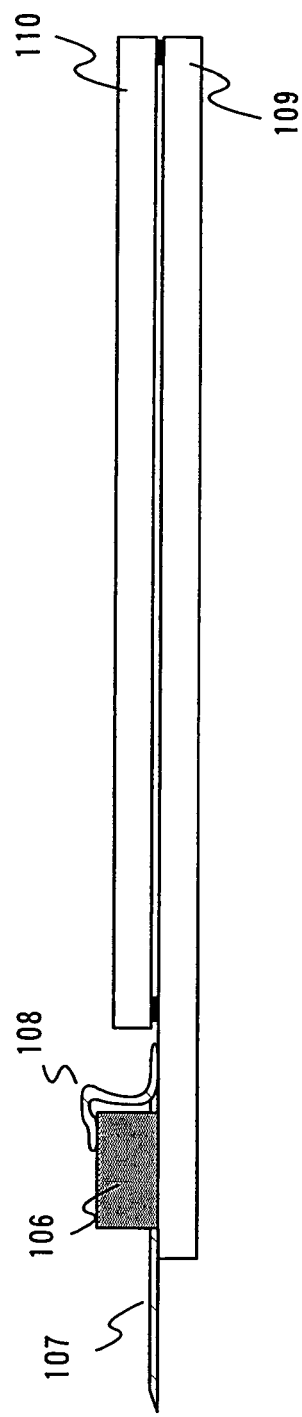

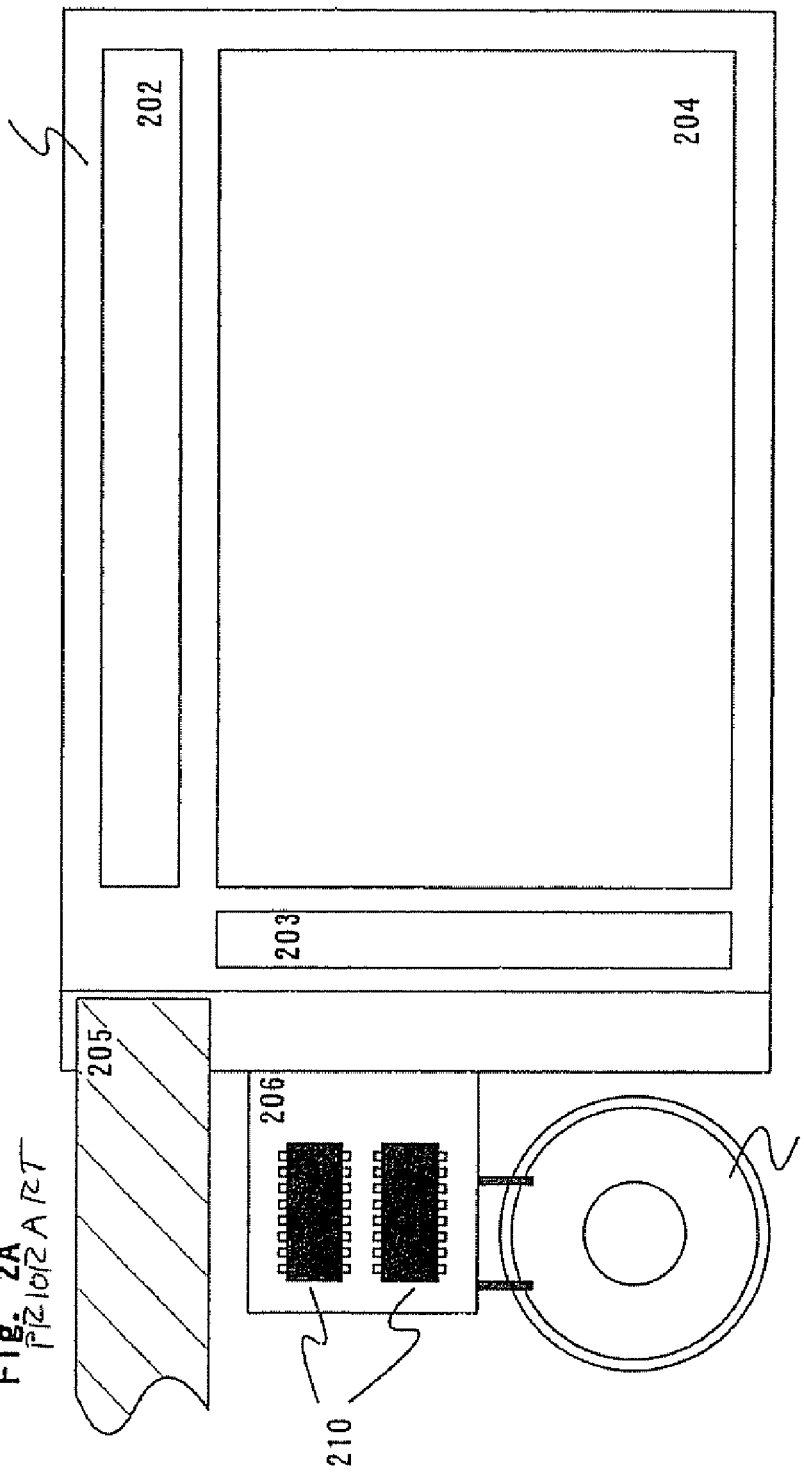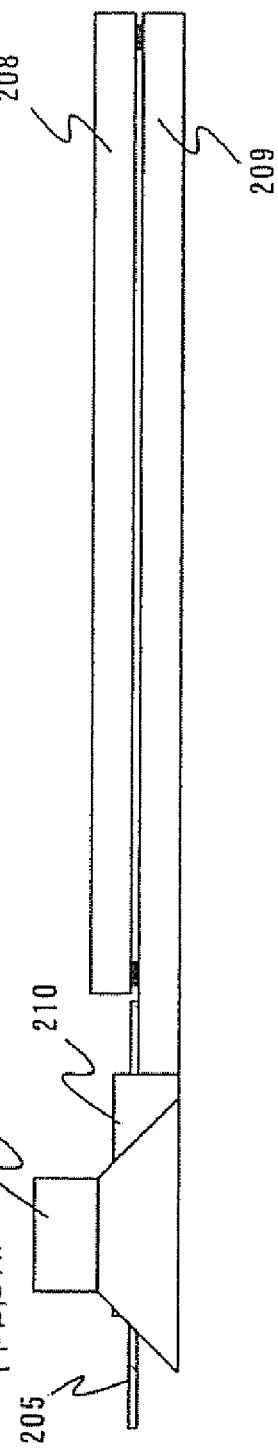
Fig. 2A PRIOR ART
Fig. 2B PRIOR ART

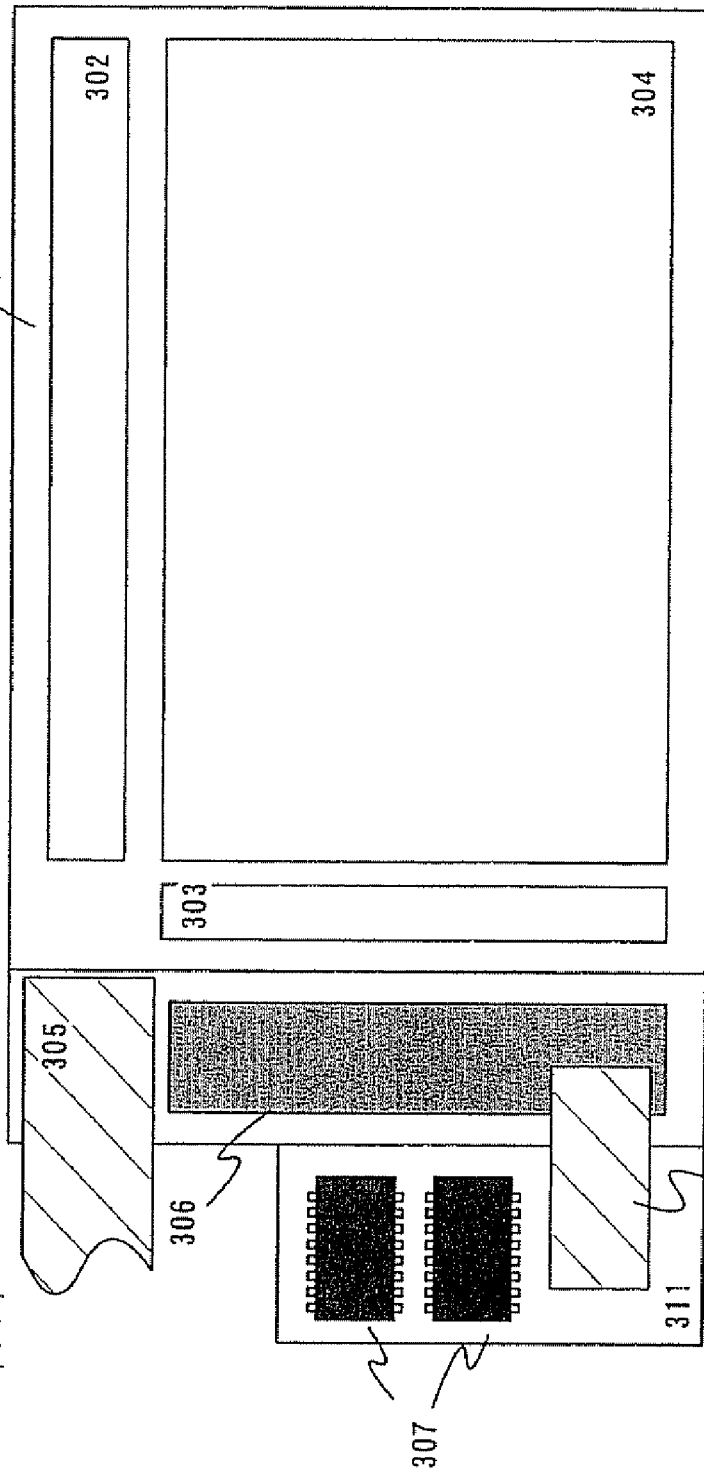
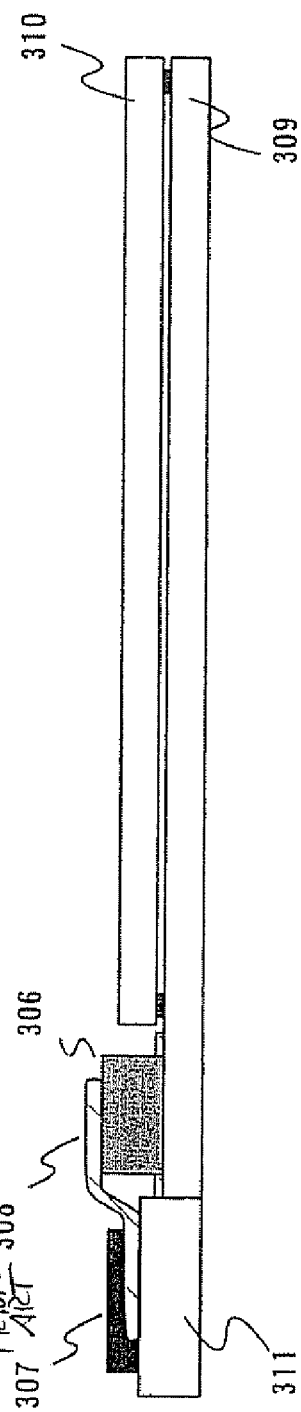
Fig. 3A PRIOR ART
Fig. 3B PRIOR ART

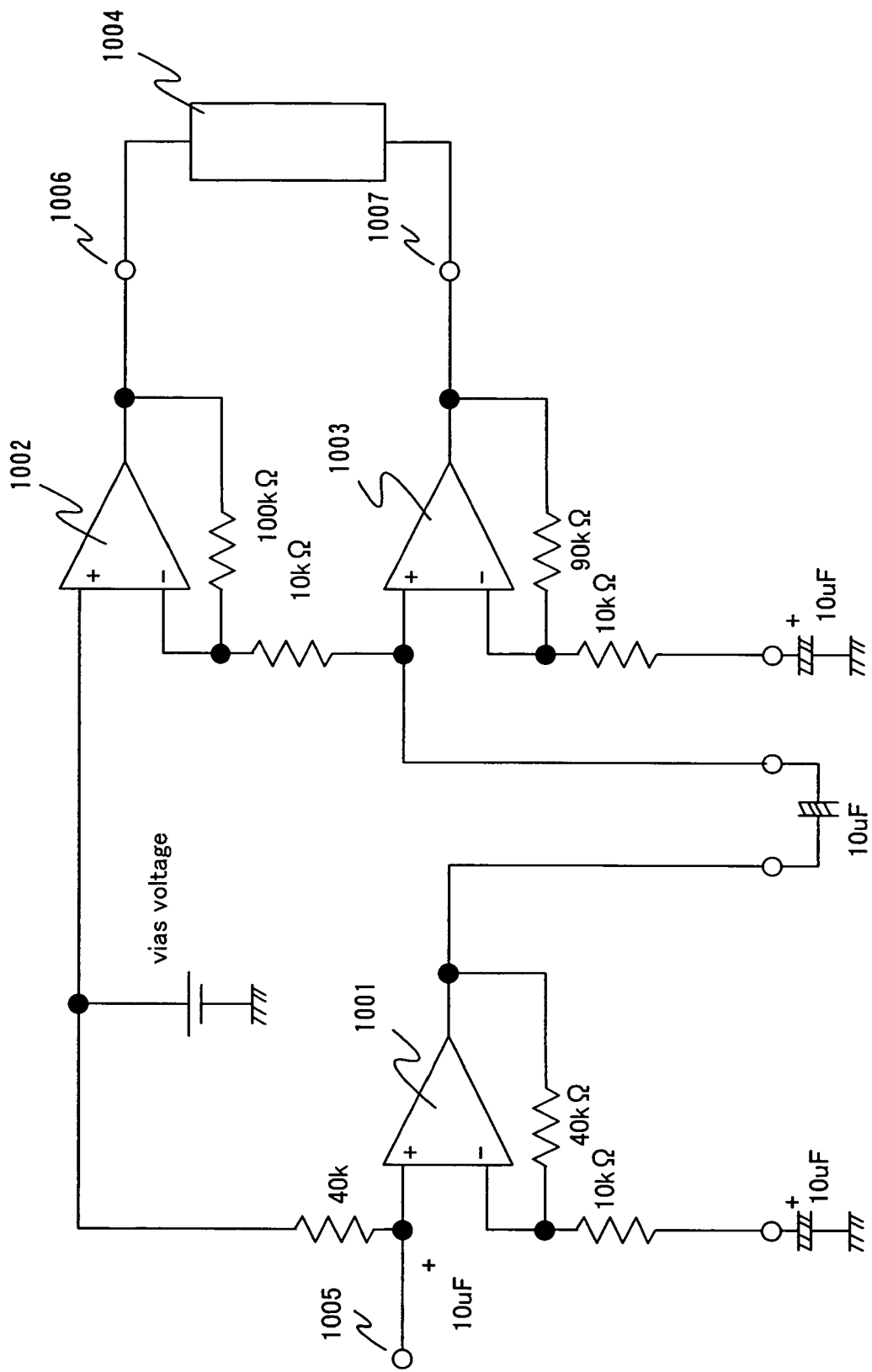

DISPLAY APPLIANCE

BACKGROUND OF THE INVENTION

1. Field of the Invention

The present invention relates to a display device having an electric signal processing circuit including thin film semiconductor elements and which drives an output device for outputting other signals than a video signal, and more specifically to a display device in which an audio signal processing circuit for driving a speaker is integrally formed on a substrate. In this specification, the term speaker includes a transducer which outputs audio by vibrating members of a display device such as a glass substrate, a plastic substrate, or a touch panel, and refers to devices in general that convert electric signals into audio.

2. Description of the Related Art

The advance of communication technologies has made cellular phones popular in recent years, and now more information communication including transmission of motion pictures is expected. Meanwhile, personal computers have become light-weight, prompting manufacture of mobile type products. Also, information terminals called PDA which originate from electronic organizers are being mass-produced and gaining popularity. Most of such portable information appliances have flat panel displays owing to development of display devices.

Among active matrix type display devices, ones that use low temperature polysilicon thin film transistors (hereinafter a thin film transistor is referred to as a TFT) has recently begun to be commercialized. Low temperature polysilicon TFTs make it possible to form not only a pixel portion but also a signal line driving circuit integrally with the driving circuit placed in the periphery of the pixel portion. Therefore, low temperature polysilicon TFTs are helpful in downsizing display devices and increasing a definition of display devices, and their further propagation is predicted.

In addition to the image display function, other output functions, an audio output function in particular, are requested for portable information appliance. With audio, image display can be more effective and accordingly more fully appreciated.

Usual audio output devices output audio by converting electric signals into audio through cone speakers or the like. Corn speakers take up a large area inside portable information appliance and therefore present an obstacle to reduction in size and weight of portable information appliance.

FIGS. 2A and 2B are profile diagrams showing a display device and its periphery in conventional portable information appliance with an audio output function. The display device has a substrate 209 on which a pixel portion 204, a source signal line driving circuit 202, and a gate signal line driving circuit 203 are formed integrally. FIG. 2A is a top view of the display device and FIG. 2B is a lateral view of the display device. A source signal line driving circuit 202, a gate signal line driving circuit 203 and a pixel portion 204 are omitted in FIG. 2B for simple display. Attached to the display device are a cone speaker 207, an FPC 205, an opposite substrate 208, and an audio signal processing circuit 210 mounted on a printed board 206.

The cone speaker 207 is unfit for reduction in size and weight of the portable information appliance due to its large size. For that reason, flat speakers as the one shown in FIGS. 3A and 3B are being developed. FIGS. 3A and 3B are profile diagrams of a display device and its periphery in portable information appliance 301 with a flat speaker. The display device has a substrate 309 on which a pixel portion 304, a source signal line driving circuit 302, and a gate signal line driving circuit 303 are formed integrally. FIG. 3A is a top view of the display device and FIG. 3B is a lateral view of the display device. A source signal line driving circuit 302, a gate signal line driving circuit 303 and a pixel portion 304 are omitted in FIG. 3B for simple display. Attached to the display device are a flat speaker 306, FPCs 305 and 308, an opposite substrate 310, and an audio signal processing circuit 307 mounted on a printed board 311.

The flat speaker is similar to conventional speakers in that electric signals are converted into vibrations to output audio but is different in that a glass substrate, a plastic substrate, a touch panel, or the like of the display device or others is vibrated instead of the cone. With such a flat speaker, the portable information appliance can have a smaller size and lighter weight than a conventional one that uses a cone speaker.

FIG. 17 shows an example of a flat speaker. In this example, a touch panel 1702, a lower substrate 1705, an adhesive 1706, and a liquid crystal panel 1704 are set in a chassis 1701 and vibrated by a speaker 1703 to output audio. (See. Nikkei Electronics, Aug. 26, 2002, p. 52)

Although flat speakers are very effective means in reducing the size and weight of portable information appliance as described above, there is the following problem to be solved:

As shown in FIGS. 3A and 3B, the audio signal processing circuit 307 for driving the flat speaker 306 has the printed board 311 placed outside the display device and an LSI is mounted on the printed board 311 similarly to conventional portable information appliance. This is still insufficient for reduction in size and weight of portable information appliance.

SUMMARY OF THE INVENTION

The present invention has been made to solve the above problem, and an object of the present invention is therefore to provide a small-sized, light-weight display device having an electric signal processing circuit which is composed of thin film semiconductor elements and which drives an output device for outputting other signals than a video signal. To attain this object, the present inventors have thought of using polysilicon TFTs on a substrate of a display device to drive a flat speaker or similar output device for outputting other signals than a video signal. Polysilicon TFTs have high driving ability unlike amorphous TFTs and therefore can drive a speaker or the like.

Hereinafter, a structure of the present invention is shown.

According to the present invention, there is provided a display device having thin film semiconductor elements on a substrate, including: an electric signal processing circuit for driving an output device which outputs other signals than a video signal, in which the electric signal processing circuit comprises thin film semiconductor elements.

Further, in the above-mentioned structure, the display device has an audio signal processing circuit including thin film semiconductor elements.

Further, in the above-mentioned structure, it is characterized in that an output signal of the audio signal processing circuit is used to drive a speaker.

According to the present invention, in the above-mentioned display device, the audio signal processing circuit includes a digital signal processing circuit.

Further, in the above-mentioned display device, the audio signal processing circuit includes a D/A converter circuit.

Further, in the above-mentioned display device, the audio signal processing circuit includes an analog signal processing circuit.

Further, in the above-mentioned display device, the analog signal processing circuit includes an operation amplifier circuit.

According to the present invention, there is provided a display device having thin film semiconductor elements on a substrate, characterized in that the thin film semiconductor elements constitute an analog signal processing circuit, and that an output signal of the analog signal processing circuit is used to drive a speaker.

Further, in the above-mentioned structure, the analog signal processing circuit has a non-inverting amplifier circuit and an inverting amplifier circuit; an output signal of the non-inverting amplifier circuit is used to drive a first terminal of a speaker; and an output signal of the inverting amplifier circuit is used to drive a second terminal of the speaker.

Further, in the above-mentioned structure, an input terminal of the non-inverting amplifier circuit and an input terminal of the inverting amplifier circuit are connected, an output signal of the non-inverting amplifier circuit is used to drive a first terminal of a speaker, and an output signal of the inverting amplifier circuit is used to drive a second terminal of the speaker.

Further, in the above-mentioned structure, an output terminal of the non-inverting amplifier circuit is connected to an input terminal of the inverting amplifier circuit, an output signal of the non-inverting amplifier circuit is used to drive a first terminal of a speaker, and an output signal of the inverting amplifier circuit is used to drive a second terminal of the speaker.

According to the present invention, there is provided a display device having thin film semiconductor elements on a substrate, in which the thin film semiconductor elements constitute an analog signal processing circuit having a first inverting amplifier circuit and a second inverting amplifier circuit, an output terminal of the first inverting amplifier circuit is connected to an input terminal of the second inverting amplifier circuit, an output signal of the first inverting amplifier circuit is used to drive a first terminal of a speaker, and an output signal of the second inverting amplifier circuit is used to drive a second terminal of the speaker.

Further, in the above-mentioned structure, the analog signal processing circuit has a pre-amplifier circuit, a non-inverting amplifier circuit and an inverting amplifier circuit, an output signal of the pre-amplifier circuit is inputted to the non-inverting amplifier circuit and the inverting amplifier circuit, an output signal of the non-inverting amplifier circuit is used to drive a first terminal of a speaker, and an output signal of the inverting amplifier circuit is used to drive a second terminal of the speaker.

Further, in the above-mentioned display device, it is characterized in that the non-inverting amplifier circuit or the inverting amplifier circuit drives the speaker through a buffer circuit.

Further, in the above-mentioned display device, it is characterized in that the analog signal processing circuit is driven at a power supply voltage lower than 30 V.

Further, in the display device, it is characterized in that the speaker is a flat speaker.

Further, in the above-mentioned display device, it is characterized in that the flat speaker uses the display device itself as a resonance body.

According to the present invention, there is provided a display device having thin film transistors on a substrate, in which: the thin film transistors constitute an analog signal processing circuit; the analog signal processing circuit has a differential circuit, a current mirror circuit, a constant current supply, a source ground amplifier, and a source follower; the constant current supply is electrically connected to a source electrode of a thin film transistor, out of the transistors of the analog signal processing circuit, that constitutes the differential circuit; a first output terminal of the differential circuit is electrically connected to an output terminal of the current mirror circuit and to an input terminal of the source ground amplifier; a second output terminal of the differential circuit is electrically connected to an input terminal of the source follower; and an output terminal of the source follower is electrically connected to an output terminal of the analog signal processing circuit.

Further, according to the present invention, there is provided a display device having thin film transistors on a substrate, in which: the thin film transistors constitute an analog signal processing circuit; the analog signal processing circuit has a differential circuit, a first current mirror circuit, a second current mirror circuit, a third current mirror circuit, and a constant current supply; the constant current supply is electrically connected to a source electrode of a thin film transistor, out of the transistors of the analog signal processing circuit, that constitutes the differential circuit; a first output terminal of the differential circuit is electrically connected to an input terminal of the first current mirror circuit; a second output terminal of the differential circuit is electrically connected to an input terminal of the second current mirror circuit; an output terminal of the first current mirror circuit is electrically connected to an output terminal of the analog signal processing circuit and to an output terminal of the third current mirror circuit; and an output terminal of the second current mirror circuit is electrically connected to an input terminal of the third current mirror circuit.

According to the present invention, there is provided a display device having thin film transistors on a substrate, in which the thin film transistors constitute an analog signal processing circuit having a differential circuit; and the differential circuit includes thin film transistors having a multi-gate structure.

Further, in the above-mentioned structure, of the thin film transistors, those in the differential circuit are connected in parallel to one another.

Further, in the above-mentioned structure, in the differential circuit, the plural thin film transistors are arranged so as to form a shape of a letter X.

Further, in the above-mentioned structure, the thin film transistors constitute an analog signal processing circuit, and of the thin film transistors of the analog signal processing circuit, thin film transistors constituting an output means include plural semiconductor thin films.

Further, in the above-mentioned display device, a distance between the plural semiconductor thin films is longer than a longer side of each of the semiconductor thin films.

According to the present invention, there is provided a display device having thin film transistors on a substrate, in which the thin film transistors constitute an analog signal processing circuit; of the thin film transistors of the analog signal processing circuit, a thin film transistor constituting an output means of the analog signal processing circuit is formed from a semiconductor thin film that has plural channel formation regions, one source region, and one drain region.

Further, in the above-mentioned display device, a distance between the plural channel formation regions of the semiconductor thin film is larger than a width of each of the channel formation regions.

Further, in the structure, it is characterized in that, of the thin film transistors of the analog signal processing circuit, a thin film transistor constituting an output means of the analog signal processing circuit includes a plurality of semiconductor thin films and a conductive film is interposed between the plural semiconductor thin films.

According to the present invention, there is provided a portable information appliance using a display device described above.

With the above-mentioned structure, downsizing of a speaker and incorporation of an audio signal processing circuit in a display device are achieved and small-sized, light-weight portable information appliance capable of outputting audio is obtained.

In the conventional portable information appliance having an audio output function, a cone speaker and a driver circuit for driving the speaker are difficult to downsize and accordingly hinder miniaturization of the portable information appliance.

The present invention provides a small-volume display device with an audio output function by using a flat speaker and by integrally forming a driver circuit for driving the speaker from thin film semiconductor elements, specifically, TFTs on a substrate. The present invention makes it possible to reduce the size and weight of portable information appliance having an audio output function.

BRIEF DESCRIPTION OF THE DRAWINGS

In the accompanying drawings:

FIGS. 1A and 1B are profile diagrams of a display device of the present invention;

FIGS. 2A and 2B are profile diagrams of a conventional display device;

FIGS. 3A and 3B are profile diagrams of the conventional display device;

FIG. 10 is a diagram showing an embodiment of the analog signal processing circuit of the present invention;

DETAILED DESCRIPTION OF THE PREFERRED EMBODIMENTS

Figure 4:
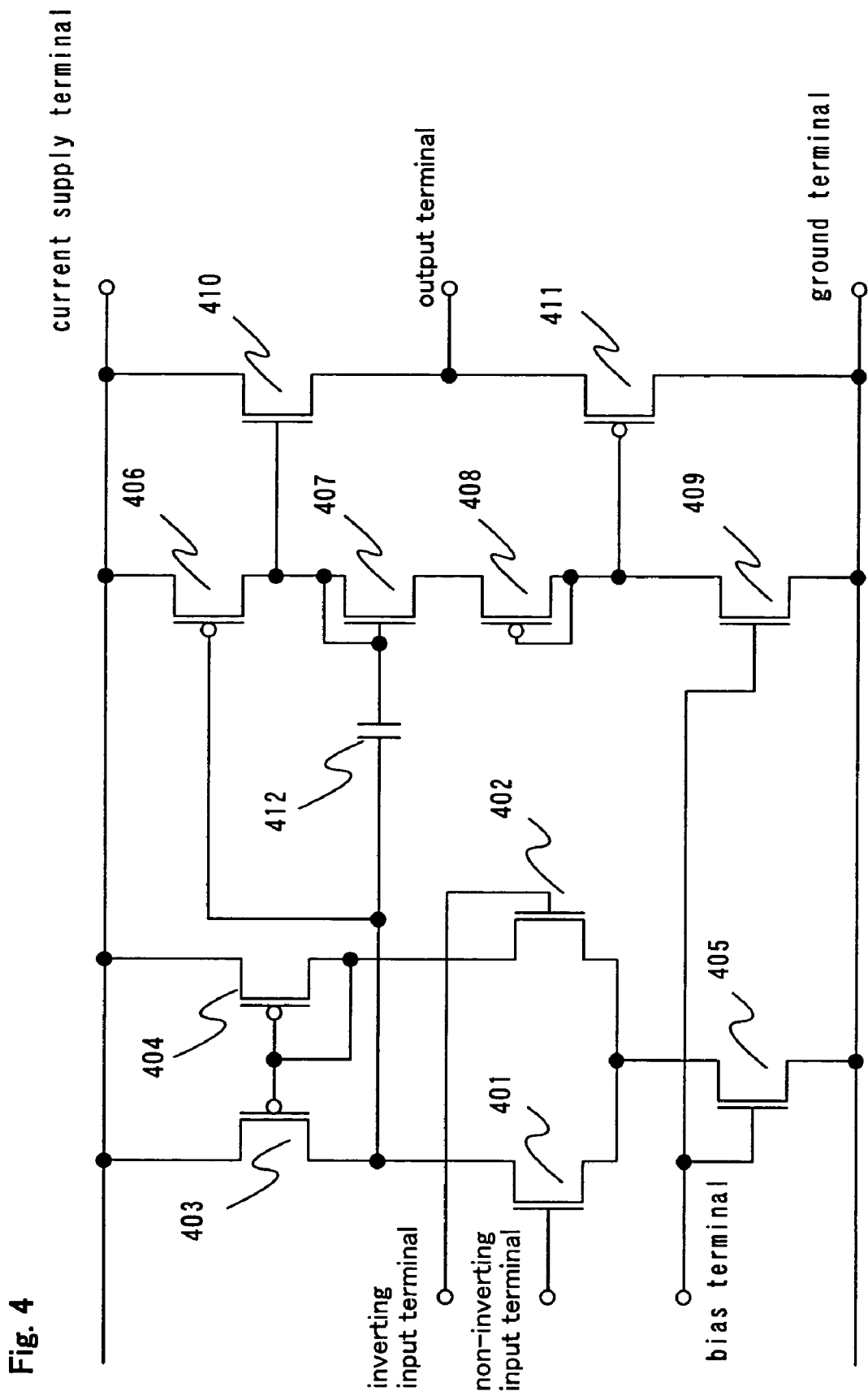
FIG. 4 is an equivalent circuit diagram of an operation amplifier circuit of the present invention.

FIGS. 1A and 1B are profile diagrams of a display device of the present invention. As shown in FIGS. 1A and 1B, a display device 101 of the present invention has a substrate 109 on which a pixel portion 104, a source signal line driving circuit 102, a gate signal line driving circuit 103, and an audio signal processing circuit 105 are integrally built from TFTs, and are topped with an opposite substrate 110. FIG. 1A is a top view of the display device 101 and FIG. 1B is a lateral view of the display device. The source signal line driving circuit 102, the gate signal line driving circuit 103, the pixel portion 104, and the audio signal processing circuit 105 are omitted in FIG. 1B for simple display. A flat speaker 106 is also mounted to the substrate 109. The flat speaker 106 does not always have to make audio by itself but instead may vibrate the substrate and the like to output audio. The flat speaker 106 is electrically connected to the audio signal processing circuit 105 through an FPC 108. External audio signals are inputted through an FPC 107 to the audio signal processing circuit 105, and then outputted through the FPC 108 to the flat speaker 106. The substrate used here is a glass substrate, a plastic substrate, a stainless steel substrate, a silicon substrate, or the like.

With an electric signal processing circuit, in particular, an audio signal processing circuit, thus integrally formed from thin film semiconductor elements such as thin film transistors, thin film resistors, and thin film capacitors on a display device, reduction in size and weight, which has not been attained by conventional portable information appliance, can be achieved in a portable information appliance having an audio output function or any other output function that is not image display function.

Embodiment 1

Figure 6:
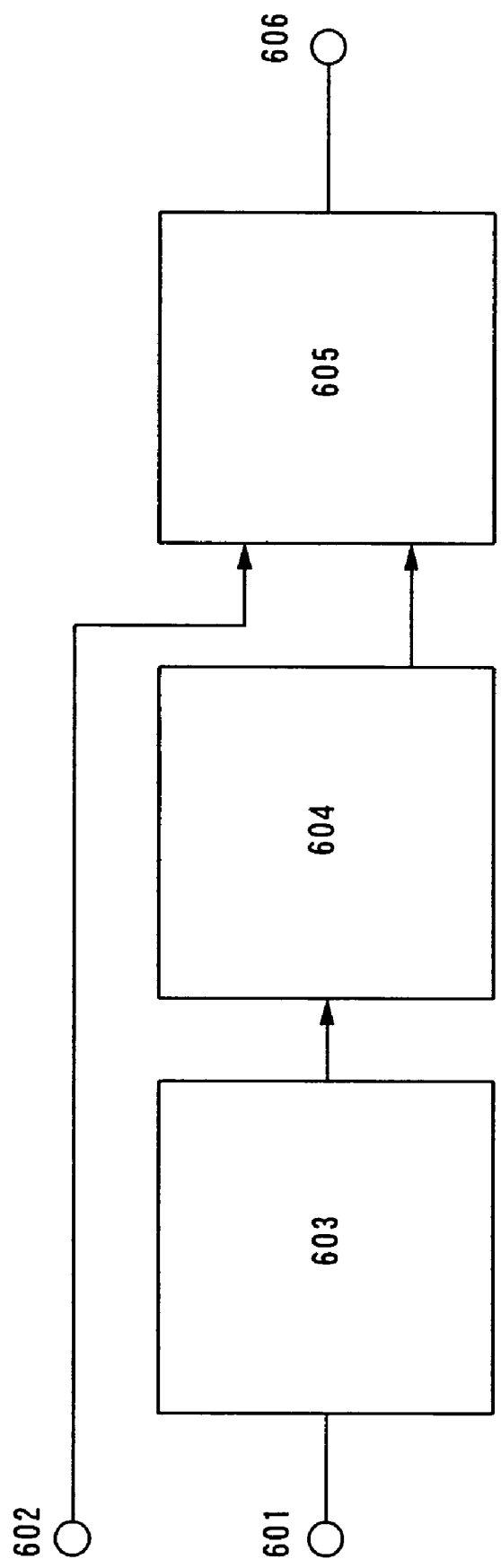
FIG. 6 is a block diagram of an audio signal processing circuit of the present invention.

FIG. 6 is a block diagram of an audio signal processing circuit. The audio signal processing circuit shown in FIG. 6 is composed of three blocks. A digital signal inputted to a digital signal input terminal 601 is computed by a digital signal processing circuit 603. The processing by the circuit 603 includes decoding of a compressed digital signal, and other computing such as filtering may be added. As the processing is finished, the digital signal is inputted to a D/A converter circuit 604 to be converted into an analog signal. The analog signal obtained by the conversion, or an analog signal inputted directly from the external to an analog signal input terminal 602 is amplified by an analog signal processing circuit 605. The amplified signal is outputted from an output terminal 606 and then outputted as audio by a speaker. The analog signal processing circuit uses operation amplifier circuits to constitute a non-inverting amplifier circuit, an inverting amplifier circuit, and others. Instead of operation amplifier circuits, other circuits may be employed.

In an alternative structure, the digital processing circuit 603 and the D/A converter circuit 604 are LSI chips whereas the analog signal processing circuit is formed from thin film semiconductor elements on the substrate.

Embodiment 2

As described above, many analog signal processing circuits use operation amplifier circuits to amplify analog audio signals. FIG. 4 is an equivalent circuit diagram in which an operation amplifier circuit is built from thin film semiconductor elements, specifically, TFTs. This operation amplifier includes: a differential circuit including a TFT 401 and a TFT 402; a current mirror circuit including a TFT 403 and a TFT 404; a constant current supply including a TFT 405 and a TFT 409; a source ground circuit including a TFT 406; an idling circuit including a TFT 407 and a TFT 408; a source follower circuit including a TFT 410 and a TFT 411; and a phase compensating capacitor 412.

The operation of the operation amplifier circuit of FIG. 4 is described below. When a plus signal is inputted to a non-inverting input terminal, the drain current of the TFT 401 becomes larger than the drain current of the TFT 402 since the constant current supply including the TFT 405 is connected to the sources of the TFTs that constitute the differential circuit. The drain current of the TFT 403 becomes equal to the drain current of the TFT 402 since the TFT 404 and the TFT 403 constitute the current mirror circuit. The difference between the drain current of the TFT 403 and the drain current of the TFT 401 causes a change that lowers the gate electric potential of the TFT 406. The TFT 406, which is a p-channel TFT, is turned ON and the drain current of the TFT 406 is increased as the gate electric potential of the TFT 406 is lowered. Therefore, the gate electric potential of the TFT 410 is raised and accordingly the source electric potential of the TFT 410, that is, the electric potential of an output terminal, is increased.

When a minus signal is inputted to the non-inverting input terminal, the drain current of the TFT 401 becomes smaller than the drain current of the TFT 402. Since the drain current of the TFT 403 is equal to the drain current of the TFT 402, the difference between the drain current of the TFT 403 and the drain current of the TFT 401 causes a change that raises the gate electric potential of the TFT 406. The TFT 406, which is a p-channel TFT, is changed to be closer to OFF status and the drain current of the TFT 406 is decreased as the gate electric potential of the TFT 406 is increased. Therefore, the gate electric potential of the TFT 410 is lowered and accordingly the source electric potential of the TFT 410, that is, the electric potential of the output terminal, is reduced. In this way, a signal of the same phase as the phase of a signal inputted to the non-inverting input terminal is outputted from the output terminal.

When a plus signal is inputted to the inverting input terminal, the drain current of the TFT 401 becomes smaller than the drain current of the TFT 402. Since the drain current of the TFT 403 is equal to the drain current of the TFT 402, the difference between the drain current of the TFT 403 and the drain current of the TFT 401 causes a change that raises the gate electric potential of the TFT 406. The TFT 406, which is a p-channel TFT, is changed to be closer to OFF status and the drain current of the TFT 406 is decreased as the gate electric potential of the TFT 406 is increased. Therefore, the gate electric potential of the TFT 410 is lowered and accordingly the source electric potential of the TFT 410, that is, the electric potential of the output terminal, is reduced.

When a minus signal is inputted to the inverting input terminal, the drain current of the TFT 401 becomes larger than the drain current of the TFT 402. Since the drain current of the TFT 403 is equal to the drain current of the TFT 402, the difference between the drain current of the TFT 403 and the drain current of the TFT 401 causes a change that lowers the gate electric potential of the TFT 406. The TFT 1406, which is a p-channel TFT, is turned ON more and the drain current of the TFT 406 is increased as the gate electric potential of the TFT 406 is decreased. Therefore, the gate electric potential of the TFT 410 is raised and accordingly the source electric potential of the TFT 410, that is, the electric potential of the output terminal, is raised. In this way, a signal of the opposite phase as the phase of a signal inputted to the inverting input terminal is outputted from the output terminal.

The differential circuit is built from n-channel TFTs and the current mirror circuit is built from p-channel TFTs in this example. However, the present invention is not limited thereto and p-channel TFTs may be used for the differential circuit whereas n-channel TFTs are employed for the current mirror circuit. The circuit connection shown here may be replaced by any circuit configuration as long as it fully carries out the function of an operation amplifier circuit.

This embodiment can be combined with the above Embodiment 1.

Embodiment 3

Figure 5:
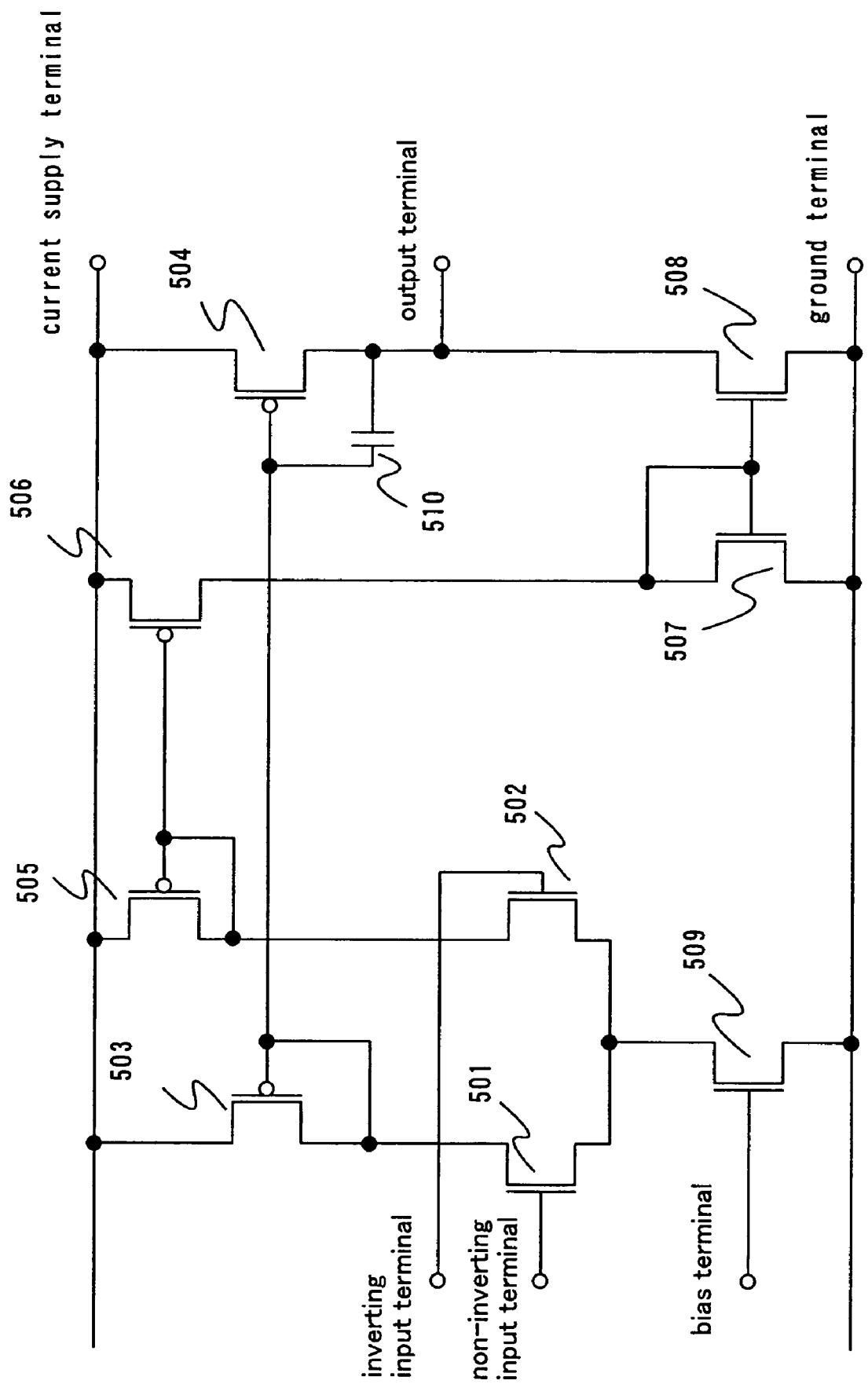
FIG. 5 is an equivalent circuit diagram of an operation amplifier circuit of the present invention.

FIG. 5 shows an example in which an operation amplifier circuit is structured differently from FIG. 4. The operation amplifier circuit in this example has as its components: a differential circuit including a TFT 501 and a TFT 502; a first current mirror circuit including a TFT 503 and a TFT 504; a second current mirror circuit including a TFT 505 and a TFT 506; a third current mirror circuit including a TFT 507 and a TFT 508; a constant current supply including a TFT 509; and a phase compensation capacitor 510.

The operation of this operation amplifier circuit is described below. When a plus signal is inputted to a non-inverting input terminal, the drain current of the TFT 501 becomes larger than the drain current of the TFT 502 since the constant current supply constituted of the TFT 509 is connected to the common source of the differential circuit. The drain of the TFT 501 is connected to the first current mirror circuit and therefore the TFT 504 receives a current flow that is in proportion to the current flow of the TFT 501. This means that the drain current of the TFT 504 is increased upon an increase in drain current of the TFT 501. The drain of the TFT 502 is connected to the second current mirror circuit, and therefore, when the current of the TFT 502 decreases, the drain current of the TFT 506 is also reduced. A drop in drain current of the TFT 506 lowers the drain current of the TFT 508 since the drain of the TFT 506 is connected to the third current mirror circuit. The electric potential of an output terminal is thus raised.

When a plus signal is inputted to an inverting input terminal, the drain current of the TFT 501 becomes smaller than the drain current of the TFT 502. The drain of the TFT 501 is connected to the first current mirror circuit and therefore the TFT 504 receives a current flow that is in proportion to the current flow of the TFT 501. This means that the drain current of the TFT 504 is decreased upon a decrease in drain current of the TFT 501. The drain of the TFT 502 is connected to the second current mirror circuit and, therefore, when the current of the TFT 1502 increases, the drain current of the TFT 506 is also increased. A rise in drain current of the TFT 506 raises the drain current of the TFT 508 since the drain of the TFT 506 is connected to the third current mirror circuit. The electric potential of an output terminal is thus lowered.

In this way, an output signal of the same phase as the phase of a signal inputted to the non-inverting input terminal is outputted to the output terminal whereas an output signal of the opposite phase to the phase of a signal inputted to the inverting input terminal is outputted to the output terminal. An advantage of this example is that the output signal amplitude can be larger than that of the operation amplifier circuit described in Embodiment 2. The polarities of the TFTs may be reversed.

This embodiment can be combined with the above Embodiment 1.

Embodiment 4

Figure 7A:
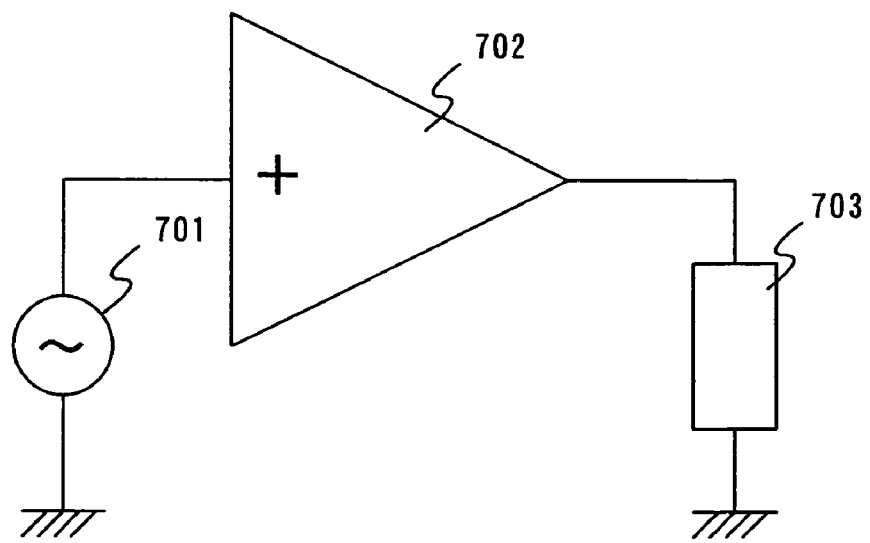
FIGS. 7A and 7B are diagrams showing how an analog signal processing circuit and a speaker are connected in the present invention.
Figure 7B:
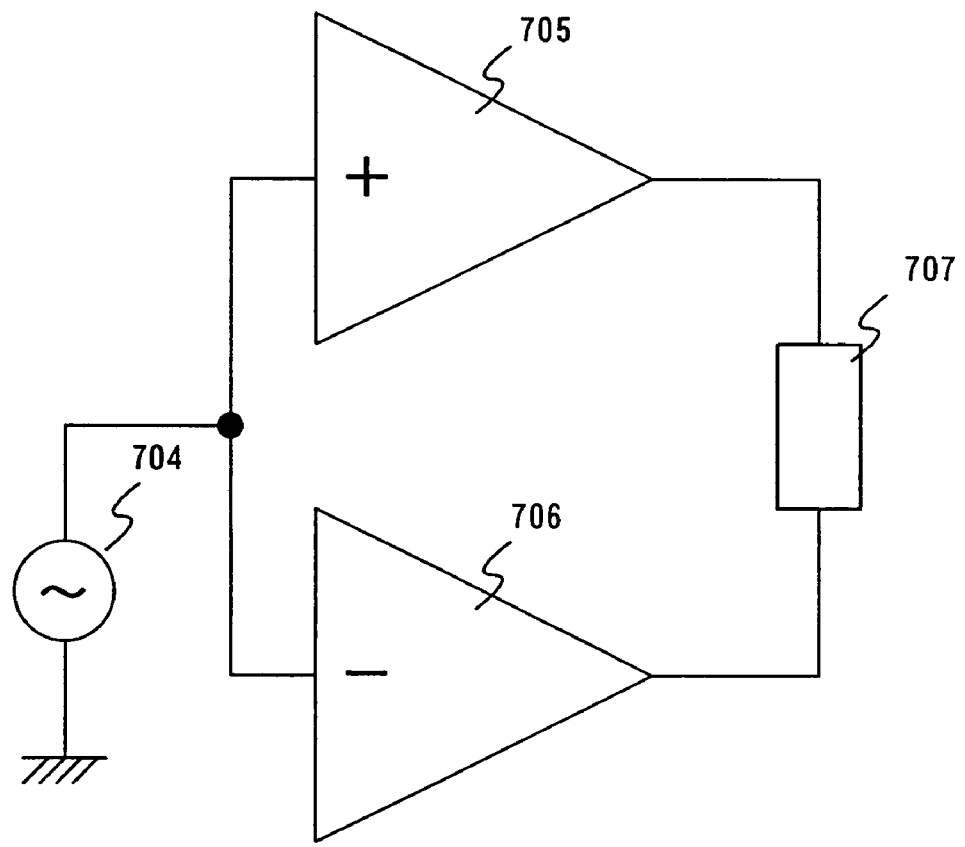

FIGS. 7A and 7B each illustrate a method of driving a speaker with an analog signal processing circuit. In many conventional methods to drive a speaker, one of two terminals of a flat speaker 703 is connected to a non-inverting amplifier circuit 702 while the other terminal is grounded as shown in FIG. 7A. Such driving methods are an option when a conventional cone speaker is used to output audio, but not when a flat speaker is employed because piezoelectric elements which are often used in flat speakers differ in element structure from cone speakers and require high voltage. To be specific, a flat speaker needs a voltage amplitude of about 10 Vrms whereas a cone speaker can provide a sound pressure necessary for portable information appliance at an amplitude of 1 Vrms.

An analog signal processing circuit 702 therefore needs a power supply voltage of 30 V or higher in the driving method of FIG. 7A. However, driving the circuit at such high voltage with a driver device including a polysilicon TFT presents a serious problem: when the drain voltage is set high, a polysilicon TFT, in particular, an n-channel polysilicon TFT, is severely degraded in characteristic, particularly gm (mutual conductance) in the linear region due to hot carriers. Various structural modifications in TFTs have been made in an attempt to solve this problem, but still the drive voltage at which a TFT is not degraded much is about 15 V when the LDD structure is employed and about 25 V when the GOLD (gate overlapped LDD) structure is employed. Because of this problem, if the driving method shown in FIG. 7A is chosen, a drive voltage of 30 V or higher is required to make polysilicon TFTs unavailable in constructing an analog signal processing circuit.

Accordingly, the present inventors have thought of driving a flat speaker by BTL (Bridged Transformer Less) driving as shown in FIG. 7B. According to the BTL driving shown in FIG. 7B, an analog signal processing circuit includes two circuits, a non-inverting amplifier circuit 705 and an inverting amplifier circuit 706, and one terminal of a flat speaker 707 is connected to the output of the non-inverting amplifier circuit 705 whereas the other terminal of the speaker is connected to the output of the inverting amplifier circuit 706. This substantially doubles the amplitude and therefore the flat speaker can be driven at an amplitude of 5 Vrms per circuit.

The driving method of FIG. 7B thus does not need a power supply voltage of 30 V and the circuit can be driven at 20 V or a lower voltage, making it possible to build the analog signal processing circuit from polysilicon TFTs.

This embodiment can be combined with the above Embodiments 1 through 3.

Embodiment 5

Figure 8A:
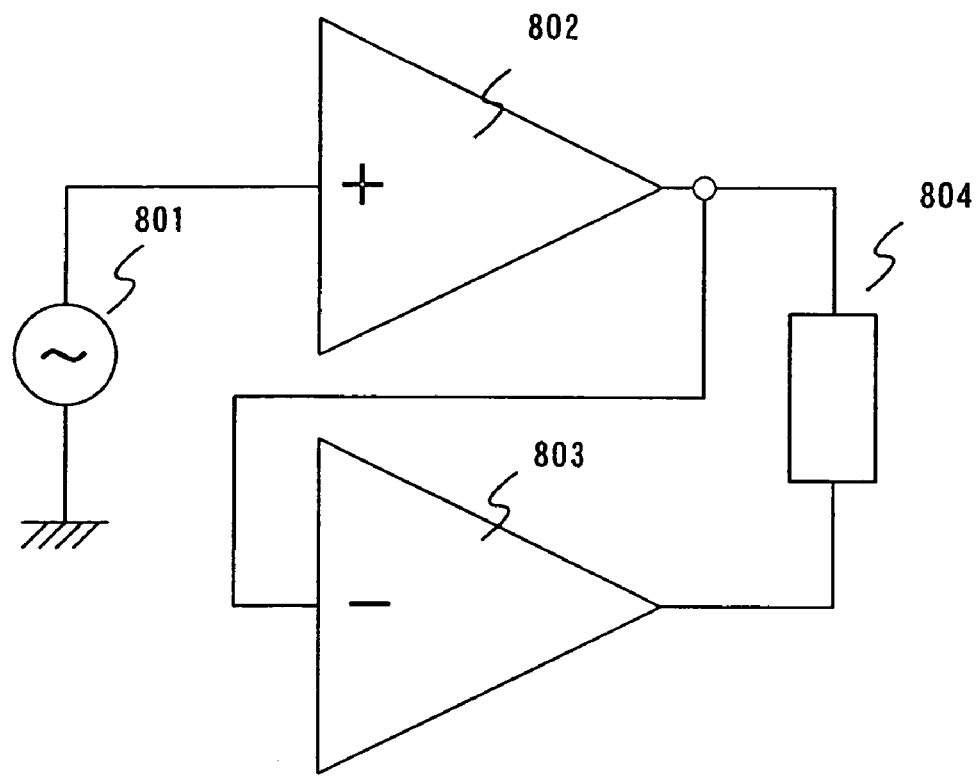
FIGS. 8A and 8B are diagrams showing how the analog signal processing circuit and the speaker are connected in the present invention.

In FIG. 8A, a non-inverting amplifier circuit 802 and an inverting amplifier circuit 803 are used for BTL driving but connected differently from Embodiment 4. Instead of inputting signals to the non-inverting amplifier circuit 802 and the inverting amplifier circuit 803 both, the non-inverting amplifier circuit 802 alone receives input signals. The input of the inverting amplifier circuit 803 is connected to the output of the non-inverting amplifier circuit 802. The non-inverting amplifier circuit 802 drives a first terminal of a speaker 804 and the input of the inverting amplifier circuit 803. The output of the inverting amplifier circuit 803 drives a second terminal of the speaker 804.

Figure 8B:
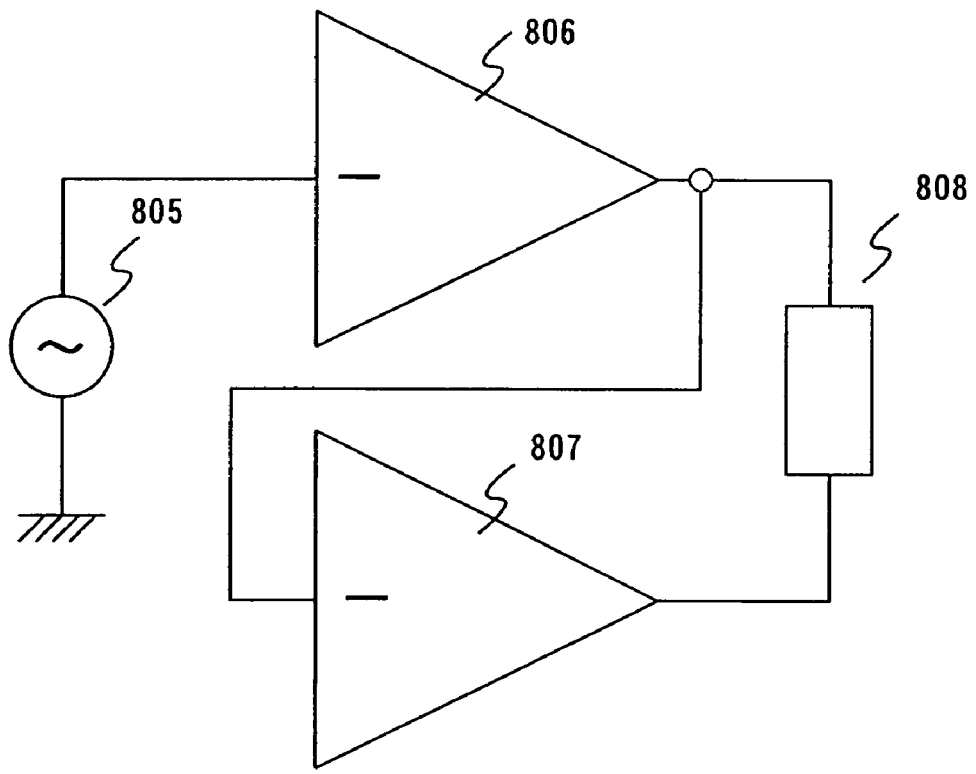

In FIG. 8B, an inverting amplifier circuit 806 and an inverting amplifier circuit 807 are used for BTL driving and connected differently from FIGS. 7B and 8A. An input signal is inputted to the inverting amplifier circuit 806 and the input of the inverting amplifier circuit 807 is connected to the output of the inverting amplifier circuit 806. The output of the inverting amplifier circuit 806 drives a first terminal of a speaker 808 and the input of the inverting amplifier circuit 807. The inverting amplifier circuit 807 drives a second terminal of the speaker 808.

This embodiment can be combined with the above Embodiments 1 through 3.

Embodiment 6

Figure 9:
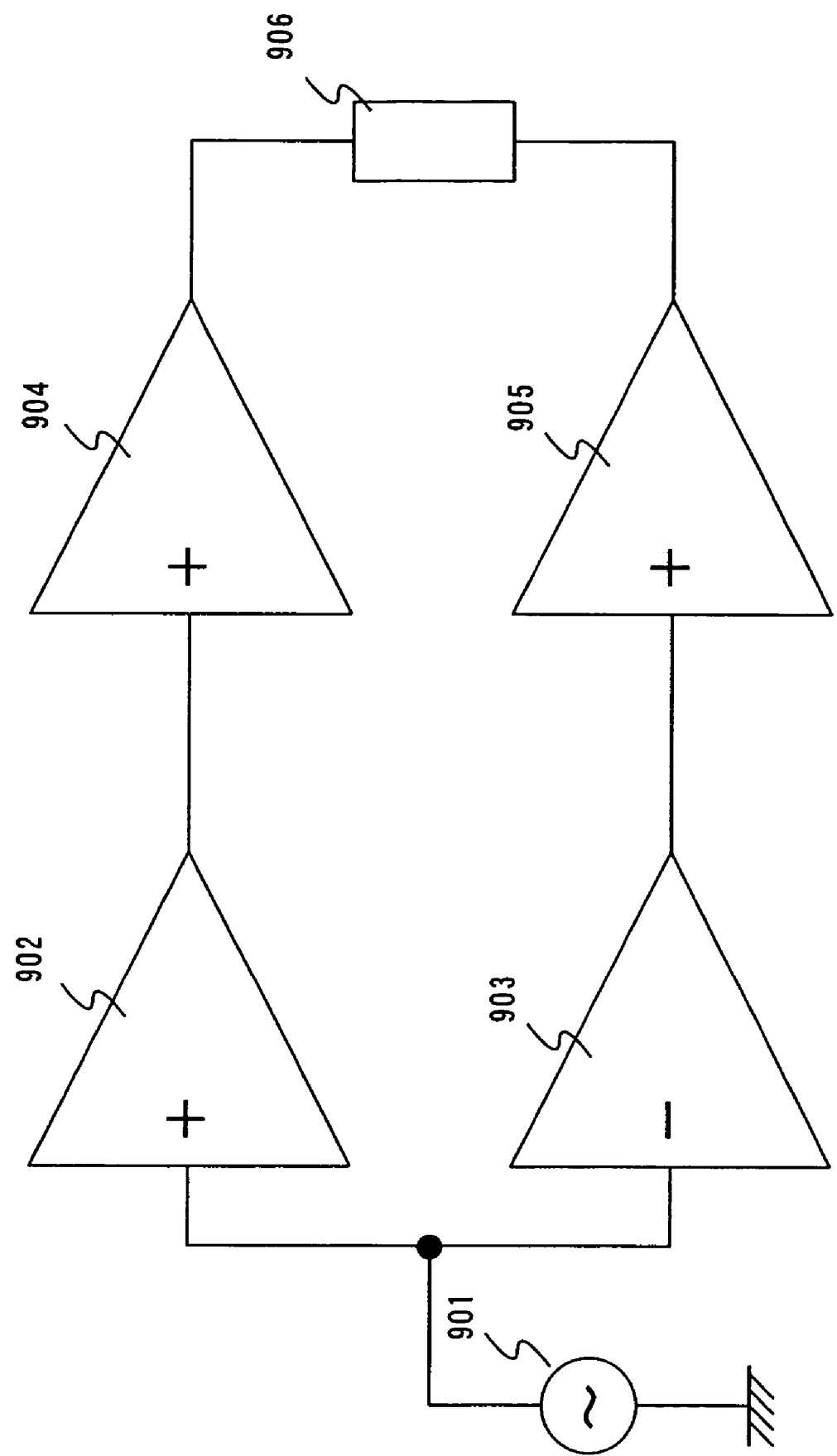
FIG. 9 is a diagram showing how the analog signal processing circuit and the speaker are connected in the present invention.

In FIG. 9, buffer circuits 904 and 905 are placed downstream of a non-inverting amplifier circuit 902 and an inverting amplifier circuit 903, respectively, so that the output of the buffer circuit 904 drives a first terminal of a speaker 906 and the output of the buffer circuit 905 drives a second terminal of the speaker 906. As in this example, a speaker may be driven through a buffer circuit. FIG. 9 is obtained by adding buffer circuits to the example shown in FIG. 7B. Alternatively, buffer circuits may be added to the circuits shown in FIG. 8A or to the circuits shown in FIG. 8B.

This embodiment can be combined with the above Embodiments 1 through 3.

Embodiment 7

FIG. 10 shows an example of an analog signal processing circuit. The voltage amplification of this circuit is set to 100 times. A signal of about 100 mVrms is inputted and amplified 5 times by a pre-amplifier circuit 1001. The signal outputted from the pre-amplifier circuit 1001 is inputted to a non-inverting amplifier circuit 1002 and an inverting amplifier circuit 1003 to be amplified 10 times each. A speaker 1004 is connected between output terminals of the non-inverting amplifier circuit 1002 and the inverting amplifier circuit 1003.

A signal amplified 50 times is generated at each end of the speaker 1004. The signal on one end of the speaker and the signal on the other end have opposite phases and therefore the final voltage amplification is 100 times. By thus using a two-stage amplifier circuit, stable amplification is obtained. Each amplifier circuit here is the operation amplifier circuit described in Embodiment 2. However, the present invention is not limited thereto and other amplifier circuit structure may be employed. The amplification and allocation of the amplification may be altered from those given in the above.

An output signal of the pre-amplifier circuit is inputted to the non-inverting amplifier circuit and the inverting amplifier circuit in the example of FIG. 10. In another example, an output signal of a pre-amplifier circuit is inputted to a non-inverting amplifier circuit, an output signal of the non-inverting amplifier circuit is inputted to an inverting amplifier circuit, and a speaker is connected between an output terminal of the non-inverting amplifier circuit and an output terminal of the inverting amplifier circuit.

In still another example, an output signal of a pre-amplifier circuit is inputted to a first inverting amplifier circuit, an output signal of the first inverting amplifier circuit is inputted to a second inverting amplifier circuit, and a speaker may be connected between an output terminal of the first inverting amplifier circuit and an output terminal of the second inverting amplifier circuit.

This embodiment can be combined with the embodiments described above.

Figure 19:
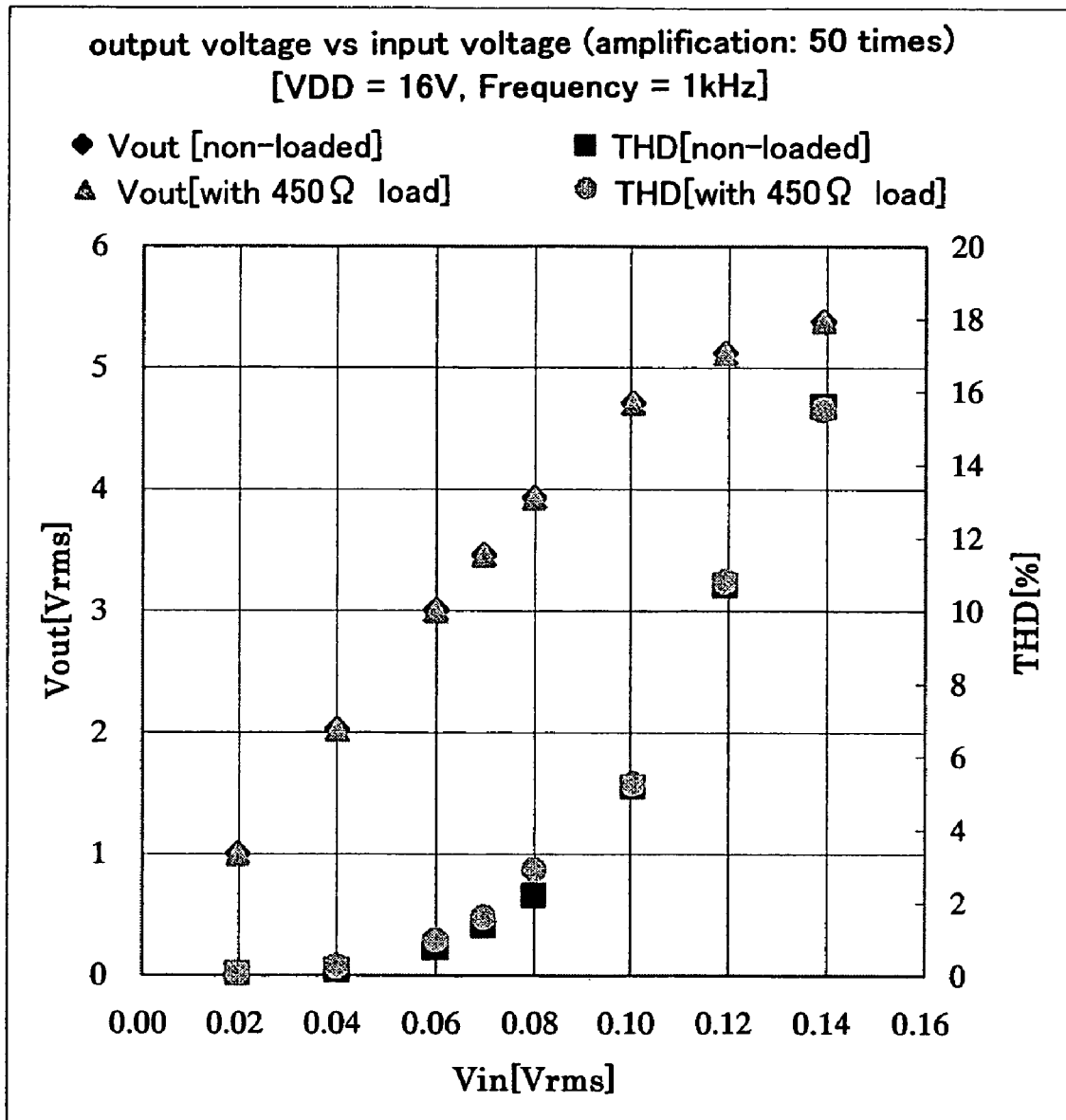
FIG. 19 is a diagram showing a result of measuring a characteristic of an amplifier.
Figure 20:
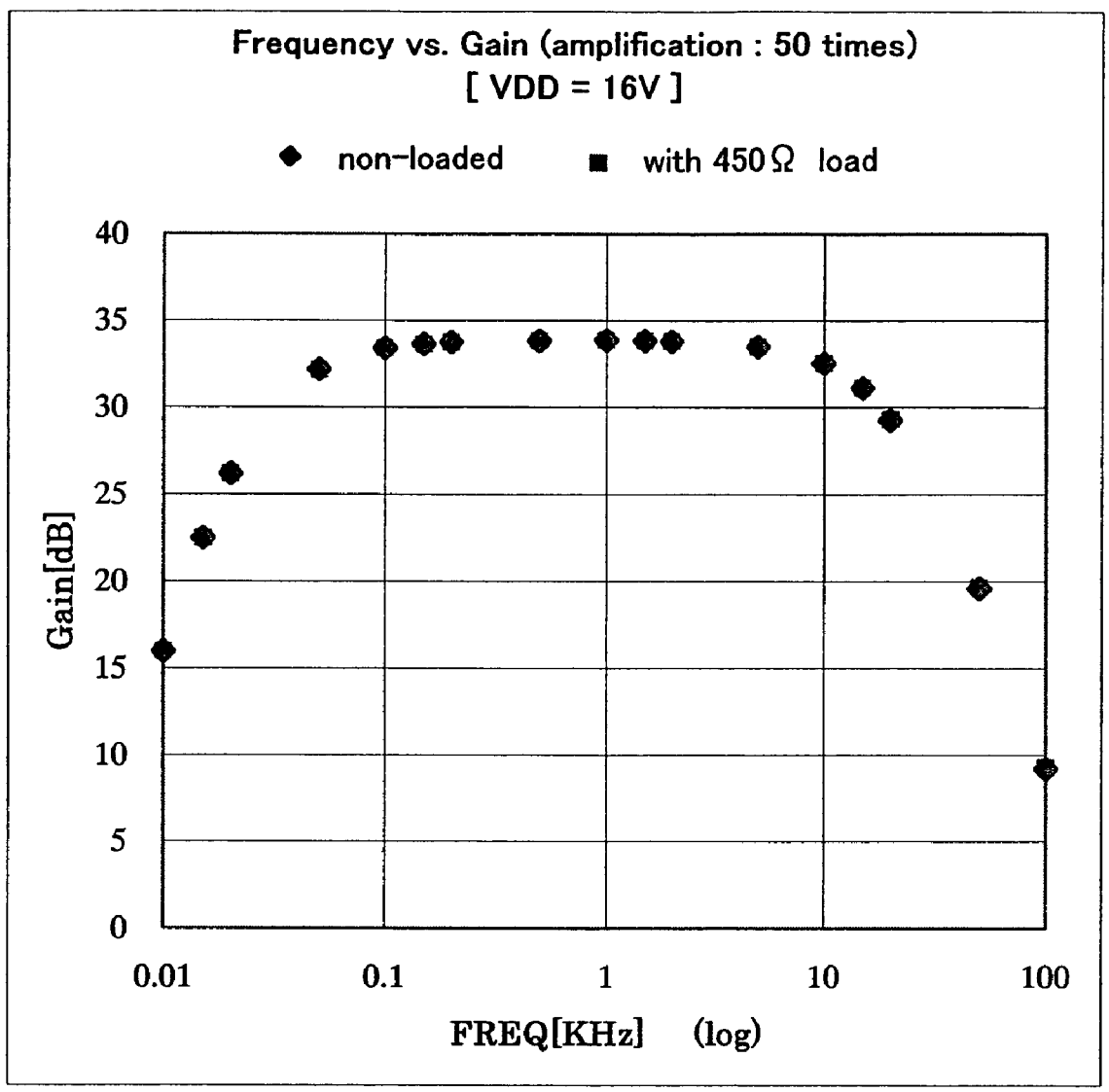
FIG. 20 is a diagram showing the result of measuring the characteristic of the amplifier.

FIGS. 19 and 20 show results of measured characteristics of a test production amplifier. The amplifier measured is a non-inverting amplifier capable of amplifying 50 times.

FIG. 19 shows a relation between an input voltage and output voltage of the amplifier and a distortion rate. Here, the distortion rate is described as THD (Total Harmonic Distortion) in FIG. 19. A slope of a voltage characteristic curve of the input voltage and the output voltage represents a gain (amplification) of the amplifier measured, and when the input voltage-output voltage relation deviates from a straight line, the output is distorted. The distortion rate here rises as the input voltage is increased. The distortion rate reaches 1% when the input voltage is 0.07 Vrms and the output voltage is approximately 3.5 Vrms, that is, 10 Vpp. This means that enough amplitude to be practical in driving a flat speaker is obtained.

FIG. 20 shows a relation between an input frequency and an output voltage. The axis of ordinate indicates a ratio (gain) of the output voltage to the input voltage of the amplifier. Here, the gains are about 34 dB, in other words, the amplification is 50 times, in a frequency range where no distortion takes place while the output voltage is lowered in a frequency range past 10 KHz. Around 15 KHz, the output voltage is lowered by 30%. This is sufficient as the frequency band of an audio signal.

Embodiment 8

Figure 11A:
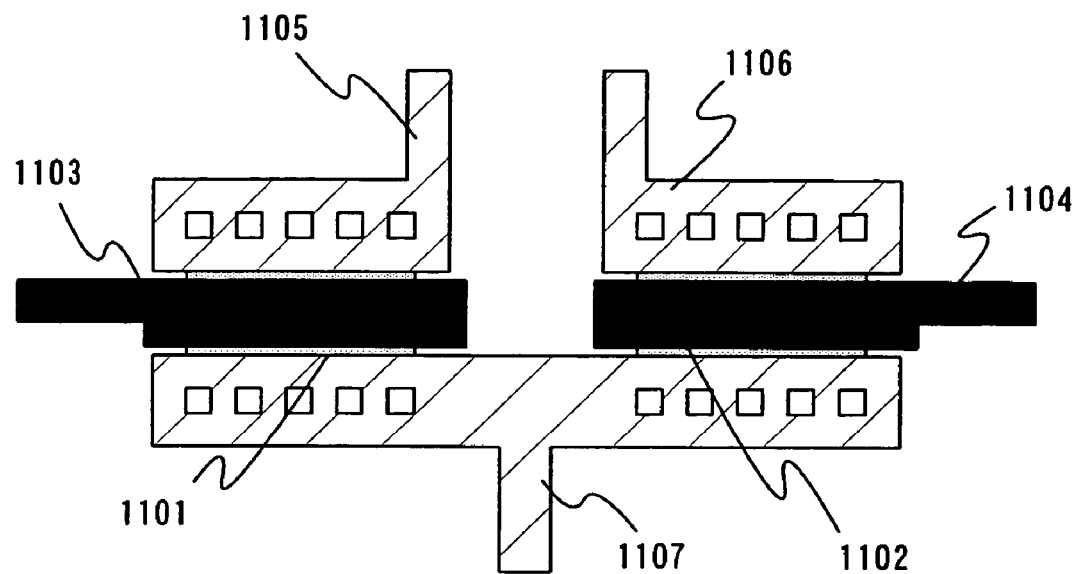
FIGS. 11A and 11B are diagrams showing an arrangement of a differential circuit.
Figure 11B:
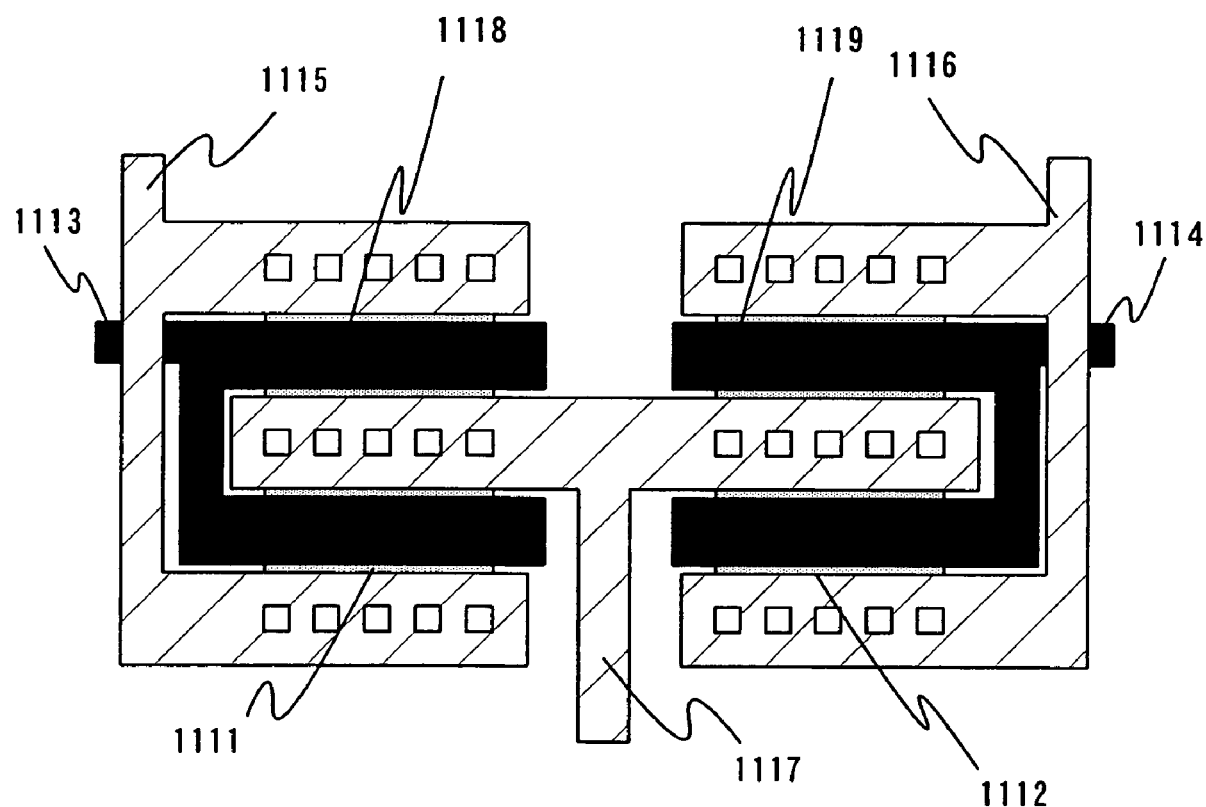

FIGS. 11A and 11B are plane views of TFTs that constitute a differential circuit of an analog signal processing circuit using an operation amplifier circuit. FIG. 11A shows a usual arrangement of the differential circuit. A TFT 1101 and a TFT 1102 are placed next to each other, and a common source electrode 1107, drain electrodes 1105 and 1106, and gate electrodes 1103 and 1104 are led out.

A balance between TFTs that constitute a differential circuit is important in an analog signal processing circuit using an operation amplifier circuit. Reaching the balance is particularly important for polysilicon TFTs because fluctuation among polysilicon TFTs is greater than that of single crystal transistors. In FIG. 11B, TFTs constituting a differential circuit are in parallel to each other as a countermeasure for TFT fluctuation. Channel formation regions 1111 and 1118 in FIG. 11B are placed next to each other to use the TFTs as one TFT. Also, channel formation regions 1112 and 1119 are placed next to each other to use the TFTs as one TFT. The channel formation regions 1111 and 1118 share a source electrode, the channel formation regions 1112 and 1119 share a source electrode, and the source electrodes are led out as a common source 1117. A drain electrode 1115 and a gate electrode 1113 for the channel formation regions 1111 and 1118 are led out. A drain electrode 1116 and a gate electrode 1114 for the channel formation regions 1112 and 1119 are led out. By employing this parallel structure, TFT characteristics are averaged and the fluctuation is reduced.

Figure 12A:
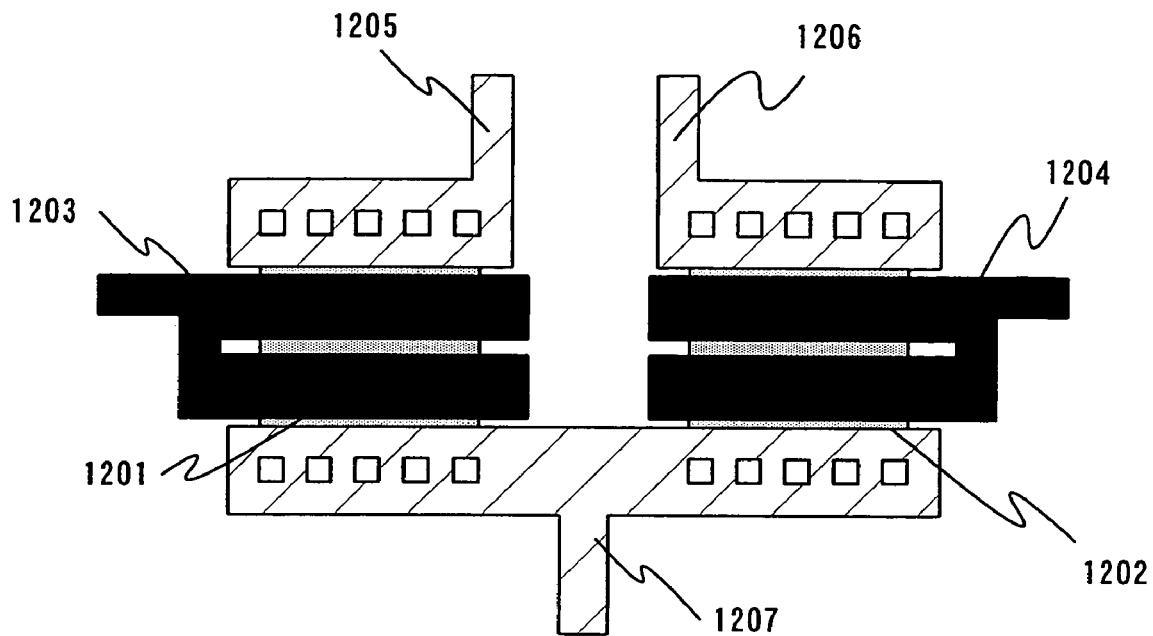
FIGS. 12A and 12B are diagrams showing the arrangement of the differential circuit.

In FIG. 12A, double gate TFTs are used to constitute a differential circuit. Drain electrodes 1205 and 1206 and a source electrode 1207 of the double gate TFTs are identical with the electrodes of FIG. 11A. The difference is that gate electrodes 1203 and 1204 each have two channel formation regions. With such double gate TFTs, TFT characteristics are averaged, the drain voltage applied to each TFT is lowered, and current shift due to a change in drain voltage can be reduced. The double gate TFTs here may be replaced by triple gate TFTs or multi-gate TFTs having more than three gate electrodes.

Figure 12B:
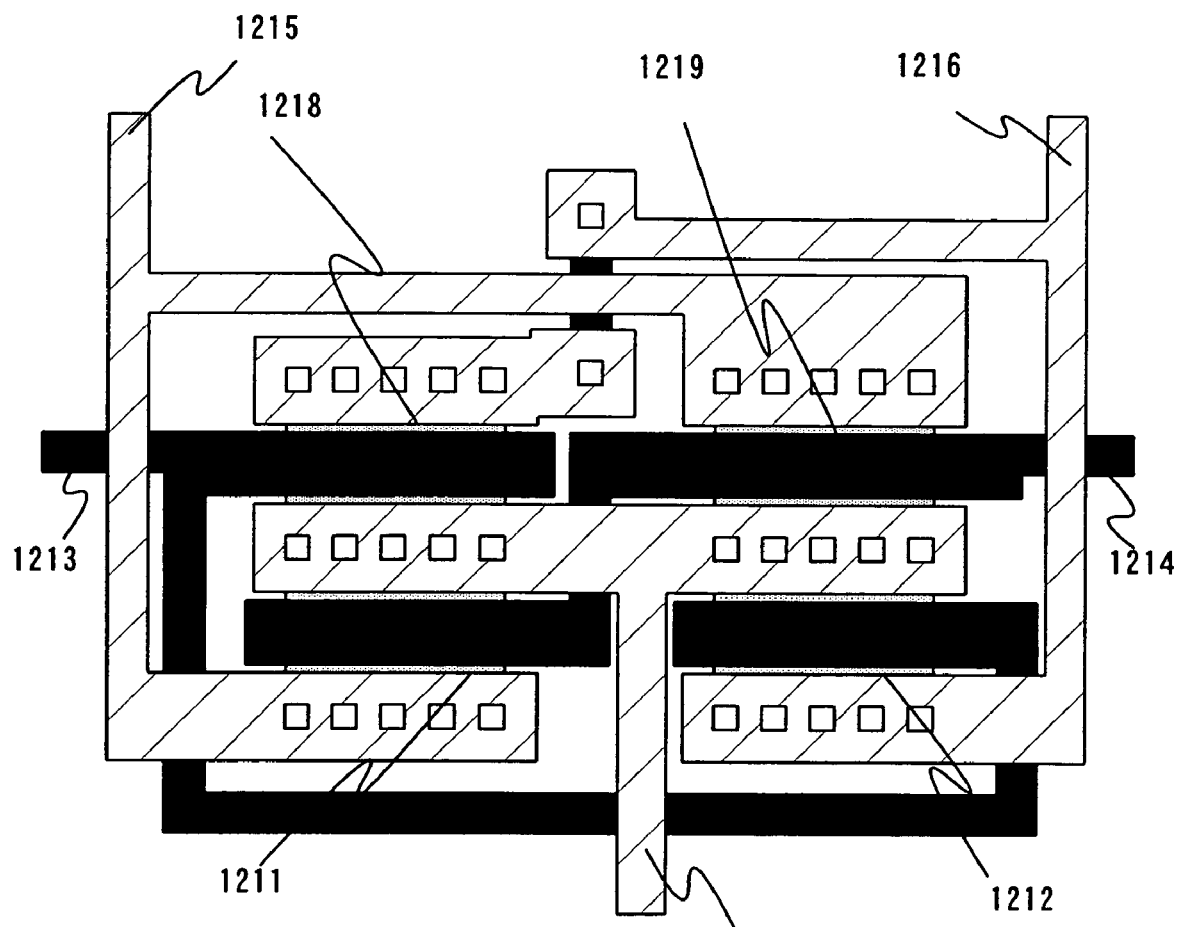

In FIG. 12B, TFTs constituting a differential circuit are arranged so as to form a shape of a letter X. According to this letter X arrangement, as shown in FIG. 12, channel formation regions 1211 and 1219 are placed crosswise to each other and connected to each other through a gate wire 1214, a source wire 1217, and a drain wire 1215. The TFTs are thus used as one TFT. Channel formation regions 1212 and 1218 are also placed crosswise to each other and connected to each other through a gate wire 1213, the source wire 1217, and a drain wire 1216, thereby using the TFTs as one TFT. The straight line connecting the channel formation region 1211 and the channel formation region 1219 to each other intersects the straight line connecting the channel formation region 1212 and the channel formation region 1218 to each other. This arrangement can reduce fluctuation caused by positional differences such as the impurity doping gradient and the varying degree of laser crystallization. It is also possible to use these countermeasures for fluctuation in combination.

This embodiment can be combined with the Embodiments described above.

Embodiment 9

Figure 13:
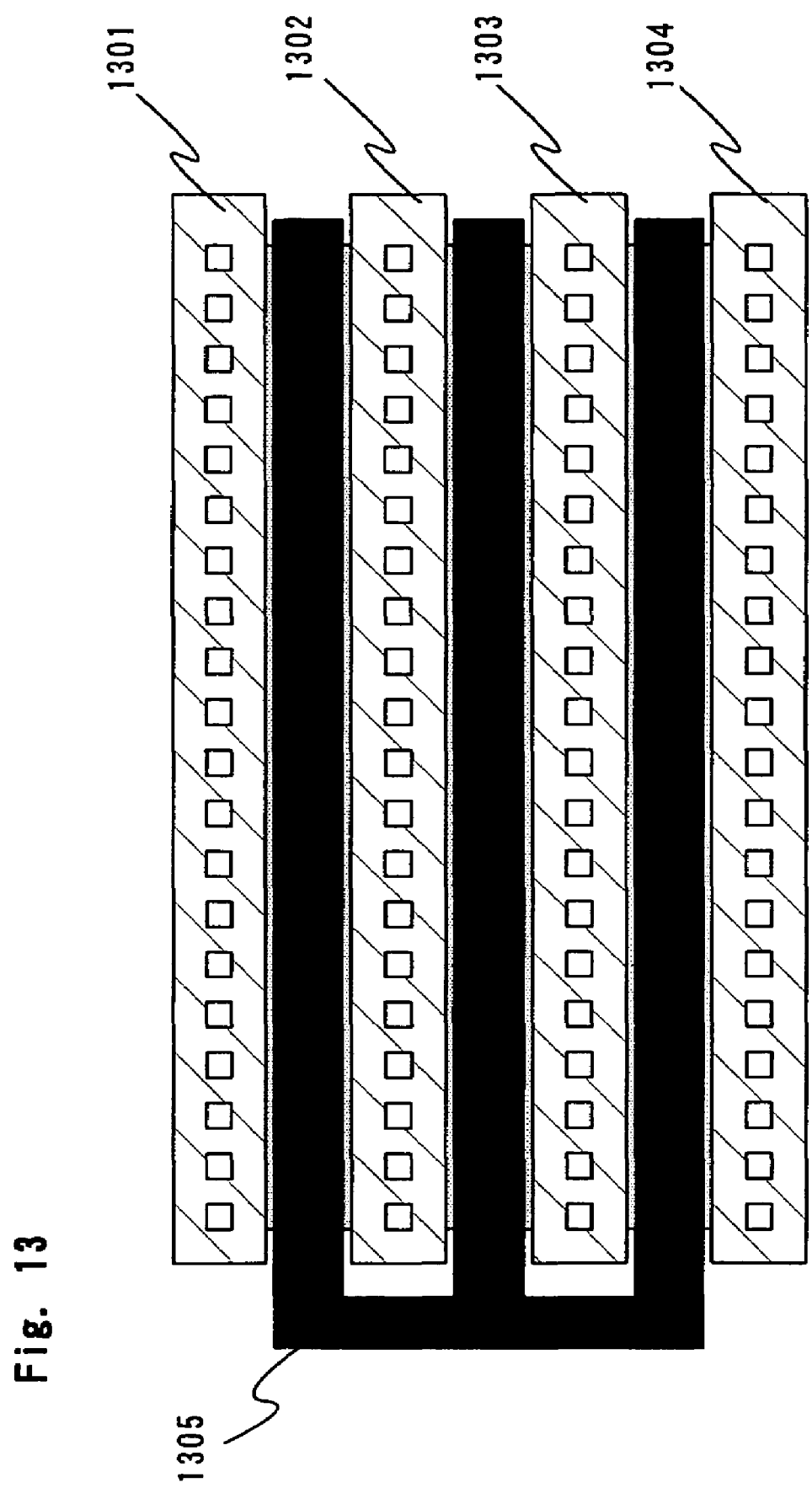
FIG. 13 is a diagram showing output TFTs of the operation amplifier circuit.

FIG. 13 shows an example of transistors constituting an output portion of an analog signal processing circuit that uses an operation amplifier circuit. The gate width has to be wide in an output portion of an operation amplifier circuit because a large current flows in the output portion when a speaker or other load is driven. In a semiconductor integrated circuit in general, the gate width is increased by reducing the area of the transistors: as shown in FIG. 13, source regions 1301 and 1303 or drain regions 1302 and 1304 are overlapped to reduce the size of the transistor. In this way, the source regions or the drain regions can be reduced although a gate wire 1305 remains unchanged.

However, a current constantly flows in an analog signal processing circuit unlike a digital signal processing circuit where a current flows only when a signal rises or falls. Accordingly, the temperature of a TFT is raised by its own heat. The temperature rise is serious particularly in a TFT formed on a glass substrate or other substrate that is small in heat conductivity, and the reliability is decreased. Therefore, some heat releasing measure has to be taken.

Figure 15:
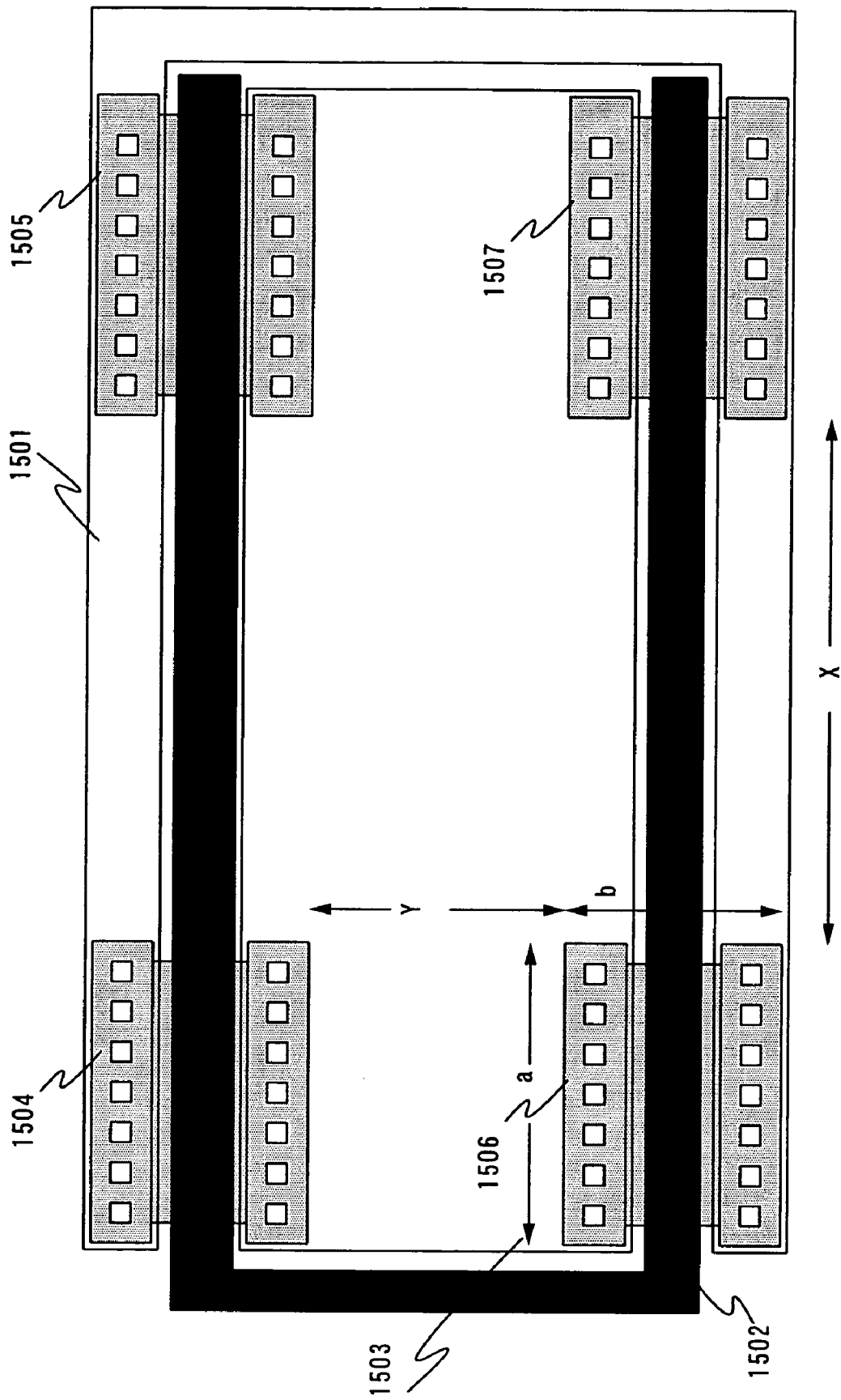
FIG. 15 is a diagram showing output TFTs of the operation amplifier circuit.

FIG. 15 shows an example in which the temperature of TFTs that constitute an output portion of an analog signal processing circuit is prevented from rising temperature by dividing the TFTs into semiconductor thin films 1504, 1505, 1506, and 1507 that are small in gate width and by distancing the semiconductor thin films from one another. Four TFTs each sized to the island 1504 are arranged keeping enough distance from one another. A gate electrode 1502, a source electrode 1501, and a drain electrode 1503 connect the semiconductor thin films to one another. Each gap between the semiconductor thin films is desirably set longer than the longer side of each semiconductor thin film since this way heat is released more effectively. In FIG. 15, a gap X and a gap Y are each longer than a long side a (a>b) of each semiconductor thin film.

Figure 14:
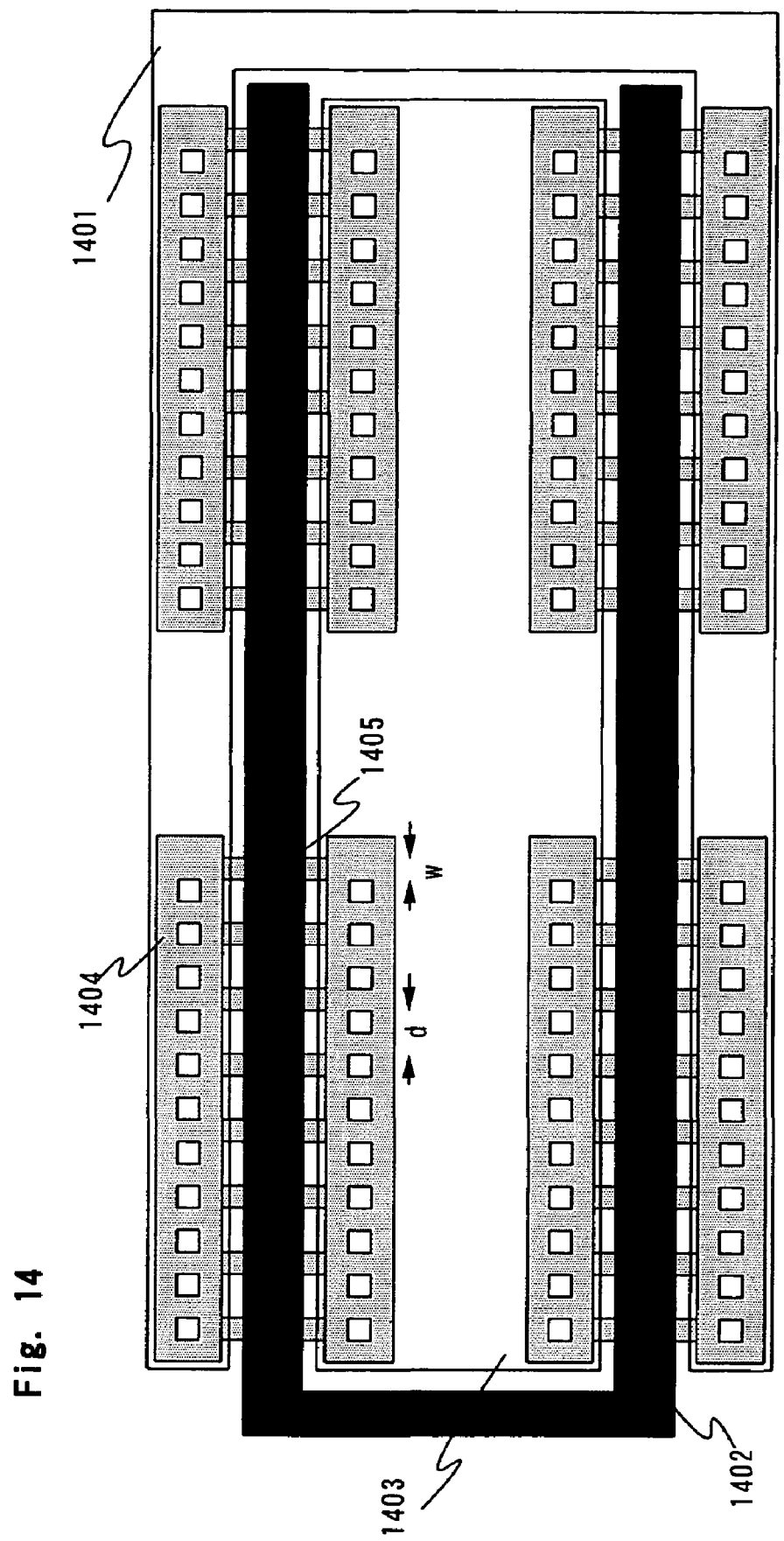
FIG. 14 is a diagram showing output TFTs of the operation amplifier circuit.

In FIG. 14, a channel formation region in each semiconductor thin film is divided into small pieces. Four TFTs each sized to a semiconductor thin film 1404 are arranged keeping enough distance from one another. A gate electrode 1402, a source electrode 1401, and a drain electrode 1403 connect the semiconductor thin films to one another. While each semiconductor thin film has divided channel formation regions, one source region and one drain region are provided in each semiconductor thin film. Breaking a channel formation region which is a heat source into pieces as this is another way to prevent the temperature rise. Here, a distance d between adjacent channel formation regions is desirably larger than a width W of each of the segmentalized channel formation regions (for example, 1405) since this way heat can be released more effectively.

Figure 16:
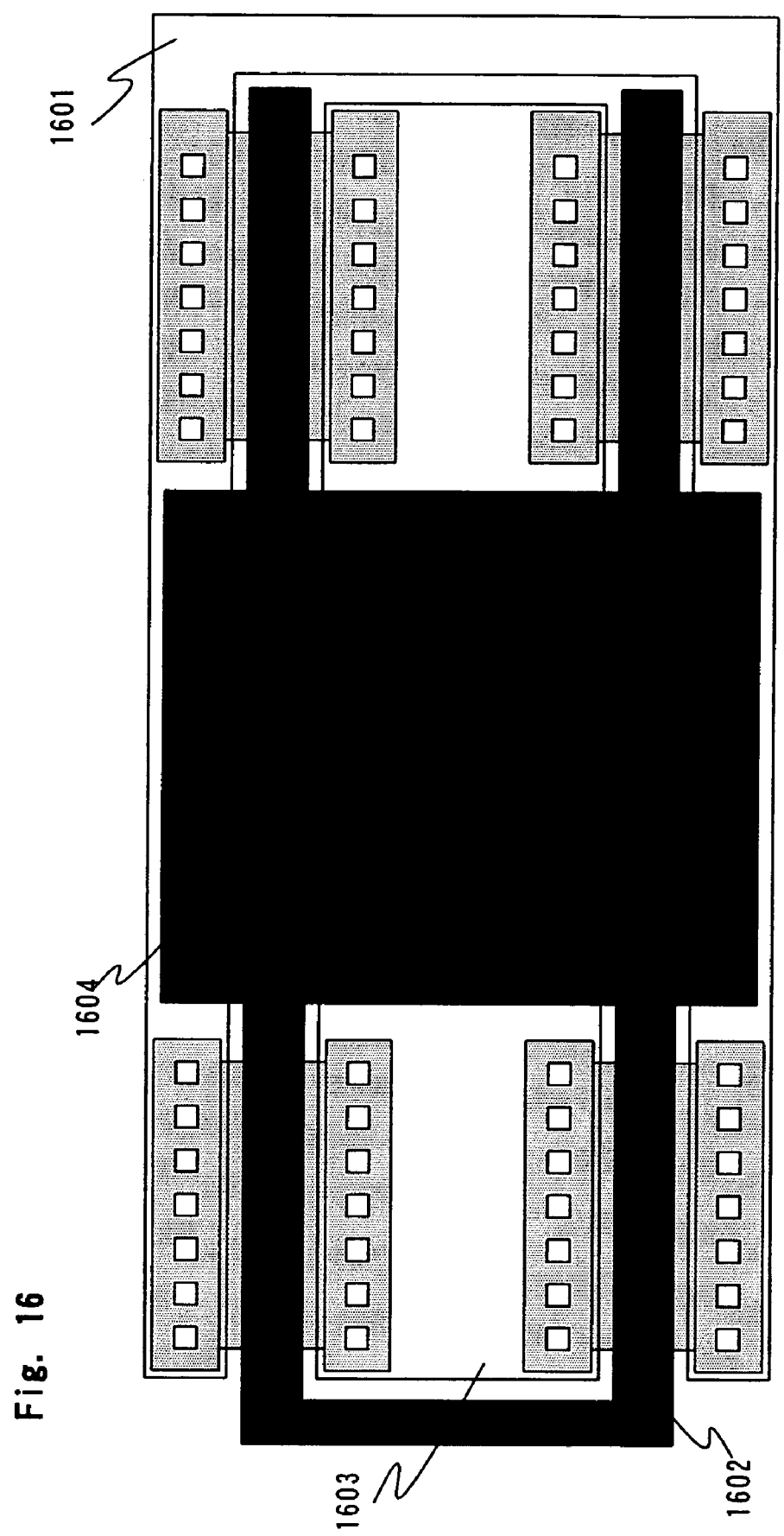
FIG. 16 is a diagram showing output TFTs of the operation amplifier circuit.
Figure 17:
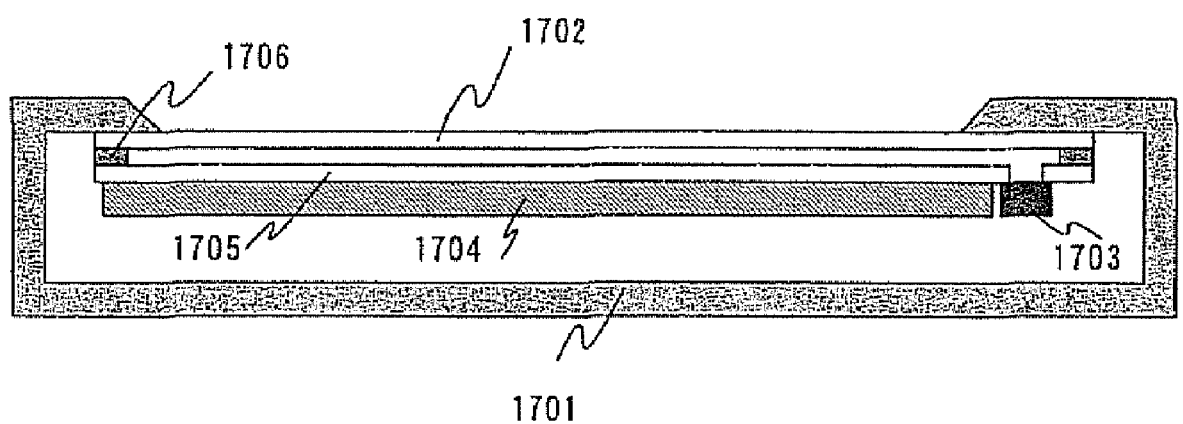
FIG. 17 is a diagram showing an example of a flat speaker.

FIG. 16 shows a modification example of FIG. 14 and a conductive film 1604 which is formed from a gate electrode 1602 is placed between the semiconductor thin films. The conductive film 1604 releases heat generated in channels of the semiconductor thin films. The gate electrode and the conductive film may not be formed from the same material. Instead, the conductive film 1604 may be formed of a source electrode material, a drain electrode material, or others. The shape of the conductive film 1604 is not limited to the one shown in FIG. 16.

By thus changing the form of output stage TFTs appropriately, the heat releasing effect can be enhanced and a circuit that is large in current consumption can be built from TFTs on a display device.

This embodiment can be combined with the embodiments described above.

Embodiment 10

A display device manufactured by the above-described method can be used in a display portion of various types of electronic appliance. Hereinafter, such electronic appliances in which the display device manufactured according to the present invention is incorporated as a display medium are described.

Such electronic appliances are as follows: video cameras, digital cameras, head mounted displays (goggle type displays), game machines, car navigation appliance, personal computers, watches, portable information terminals (mobile computers, cellular phones or electronic books etc.) etc. Practical examples thereof are shown in FIGS. 18A to 18G.

Figure 18A:
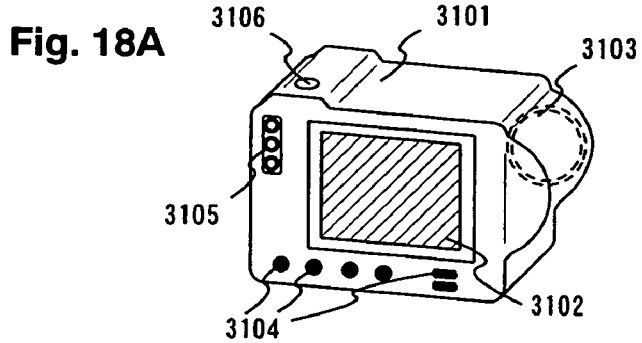
FIGS. 18A to 18G are diagrams showing examples of electronic appliance that uses the display device of the present invention.

FIG. 18A is a digital camera which includes a main body 3101, a display portion 3102, an image receiving section 3103, operation keys 3104, an external connecting port 3105, a shutter 3106 and the like. A display device of the present invention can be used in the display portion 3102 of the camera to obtain a digital camera having a speaker that is smaller than a conventional camera.

Figure 18B:
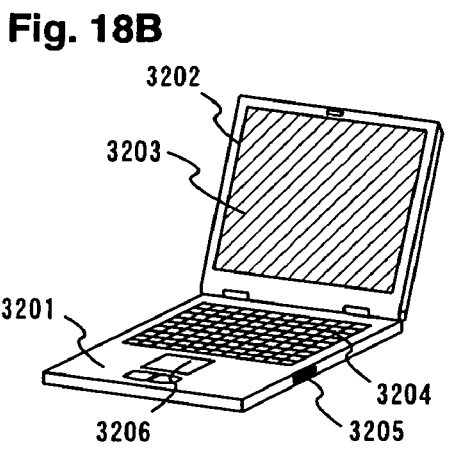

FIG. 18B is a laptop personal computer which includes a main body 3201, a casing 3202, a display portion 3203, a keyboard 3204, an external connecting port 3205, a pointing mouse 3206 and the like. A display device of the present invention can be used in the display portion 3203 to obtain a laptop personal computer that is smaller and more portable than a conventional laptop personal computer.

Figure 18C:
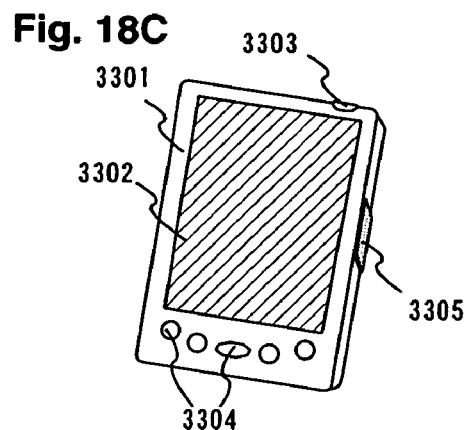

FIG. 18C is a portable information terminal which includes a main body 3301, a display portion 3302, a switch 3303, operation keys 3304, an infrared port 3305 and the like. A display device of the present invention can be used in the display portion 3302 to obtain a more portable information terminal that is smaller than a conventional portable information terminal.

Figure 18D:
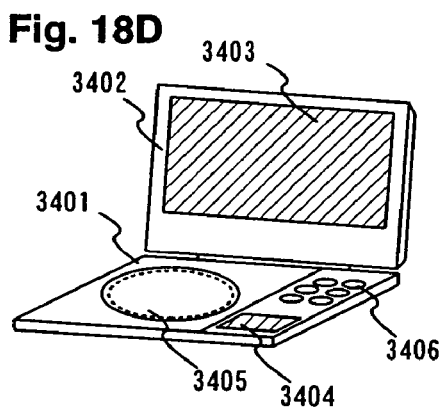

FIG. 18D is an image reproducing appliance provided with a recording medium (specifically, DVD reproducing appliance) which includes a main body 3401, a casing 3402, a display portion A 3403, a display portion B 3404, a recording medium (such as a CD, a LD or a DVD) read-in section 3405, operation keys 3406 and the like. The display portion A 3403 mainly displays image information, and the display portion B 3404 mainly displays character information. A display device of the present invention can be used in the display portion A 3403 and in the display portion B 3404 of the image reproducing appliance having the recording medium to obtain image reproducing appliance that is smaller and more portable than conventional image reproducing appliances. Note that CD reproducing appliance, game machines and the like are included in the image reproducing appliance provided with a recording medium.

Figure 18E:
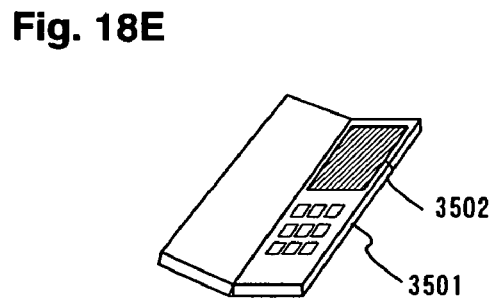

FIG. 18E is a folding portable display appliance which includes a main body 3501, a display portion 3502 and the like. A display device of the present invention is used in the display portion 3502 to obtain a folding portable display device that is smaller and more portable than a conventional folding display device.

Figure 18F:
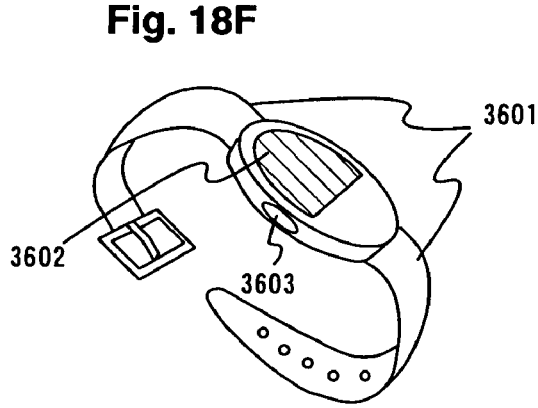

FIG. 18F is a watch which includes a belt 3601, a display portion 3602, an operation switch 3603 and the like. A display device of the present invention is used in the display portion 3602 to obtain a watch that has an audio output function.

Figure 18G:
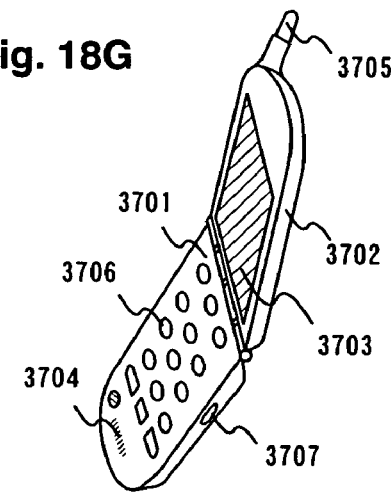

FIG. 18G is a cellular phone which includes a main body 3701, a casing 3702, a display portion 3703, an audio input section 3704, an antenna 3705, operation keys 3706, an external connecting port 3707 and the like. A display device of the present invention is used in the display portion 3703 to obtain a cellular phone that is smaller and more portable than a conventional cellular phone.

As described above, the applicable range of the present invention is so wide that the invention can be applied to electronic appliance of various fields. Note that the electronic appliance of this embodiment can be achieved by utilizing any combination of structures in Embodiments 1 to 9.

What is claimed is:

1. An apparatus for a display driving system having an audio system comprising: a display control circuit for a display device, an analog signal processing circuit formed over a substrate, the analog signal processing circuit comprising: a non-inverting amplifier circuit ; and an inverting amplifier circuit, wherein an output terminal of the non-inverting amplifier circuit is adapted to be electrically connected to a first terminal of a speaker, wherein an output terminal of the inverting amplifier circuit is adapted to be electrically connected to a second terminal of the speaker, and wherein each of the non-inverting amplifier circuit and the inverting amplifier circuit comprises polysilicon TFTs.

2. A display device according to claim 1, wherein one of the non-inverting amplifier circuit and the inverting amplifier circuit drives the speaker through a buffer circuit.

3. A display device according to claim 1, wherein the analog signal processing circuit is driven at a power supply voltage lower than 30 V.

4. A display device according to claim 1, wherein the speaker is a flat speaker.

5. A display device according to claim 4, wherein the flat speaker uses the display device itself as a resonance body.

6. A portable information appliance comprising a display device of claim 1.

7. A portable information appliance according to claim 6, wherein the portable information appliance is selected from the group consisting of a digital camera, a laptop personal computer, a personal digital assistant, an image reproducing appliance, a folding portable display appliance, a watch and a cellular phone.

8. An apparatus for a display driving system having an audio system comprising: display control circuit for a display device, an analog signal processing circuit formed over a substrate, the analog signal processing circuit comprising: a non-inverting amplifier circuit ; and an inverting amplifier circuit, wherein an input terminal of the non-inverting amplifier circuit and an input terminal of the inverting amplifier circuit are Connected to each other, wherein an output terminal of the non-inverting amplifier circuit is adapted to be electrically connected to a first terminal of a speaker, wherein an output terminal of the inverting amplifier circuit is adapted to be electrically connected to a second terminal of the speaker, and wherein each of the non-inverting amplifier circuit and the inverting amplifier circuit comprises polysilicon TFTs.

9. A display device according to claim 8, wherein one of the non-inverting amplifier circuit and the inverting amplifier circuit drives the speaker though a buffer circuit.

10. A display device according to claim 8, wherein the analog signal processing circuit is driven at a power supply voltage lower than 30 V.

11. A display device according to claim 8, wherein the speaker is a flat speaker.

12. A display device according to claim 11, wherein the flat speaker uses the display device itself as a resonance body.

13. A portable information appliance comprising a display device of claim 8.

14. A portable information appliance according to claim 13, wherein the portable information appliance is selected from the group consisting of a digital camera, a laptop personal computer, a personal digital assistant, an image reproducing appliance, a folding portable display appliance, a watch and a cellular phone.

* * * * *